US 12,051,998 B2

(12) United States Patent
Hashinaga

(10) Patent No.: US 12,051,998 B2
(45) Date of Patent: Jul. 30, 2024

(54) AMPLIFIER CIRCUIT

(71) Applicant: SUMITOMO ELECTRIC INDUSTRIES, LTD., Osaka (JP)

(72) Inventor: Tatsuya Hashinaga, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 138 days.

(21) Appl. No.: 17/726,667

(22) Filed: Apr. 22, 2022

(65) Prior Publication Data

US 2022/0416727 A1    Dec. 29, 2022

(30) Foreign Application Priority Data

Jun. 29, 2021   (JP) .................................. 2021-107629

(51) Int. Cl.
| | |
|---|---|
| H03F 1/06 | (2006.01) |
| H03F 1/14 | (2006.01) |
| H03F 1/30 | (2006.01) |
| H03F 1/56 | (2006.01) |
| H03F 3/195 | (2006.01) |
| H03F 3/54 | (2006.01) |

(52) U.S. Cl.
CPC ................ *H03F 1/06* (2013.01); *H03F 1/14* (2013.01); *H03F 1/30* (2013.01); *H03F 1/565* (2013.01); *H03F 3/195* (2013.01); *H03F 3/54* (2013.01)

(58) Field of Classification Search
CPC ..... H03F 1/06; H03F 1/14; H03F 3/54; H03F 2200/387; H03F 2200/408; H03F 2200/411; H03F 2200/451; H03F 1/565; H03F 3/195; H03F 2200/318; H03F 1/30

USPC ............................ 330/289, 98, 302; 332/153
See application file for complete search history.

(56) References Cited

U.S. PATENT DOCUMENTS

| | | | |
|---|---|---|---|
| 7,332,966 B2 * | 2/2008 | Furuya .................. | H03G 3/004 330/285 |
| 2005/0208909 A1 | 9/2005 | Maya et al. | |
| 2007/0194853 A1 | 8/2007 | Mori et al. | |
| 2017/0244369 A1 | 8/2017 | Mimis et al. | |

FOREIGN PATENT DOCUMENTS

| | | |
|---|---|---|
| JP | 2003-037448 A | 2/2003 |
| JP | 2005-269351 A | 9/2005 |
| JP | 2017-529747 A | 10/2017 |
| WO | 2006/006244 A1 | 1/2006 |

OTHER PUBLICATIONS

Ozgur Aktas et al., "High temperature characteristics of AlGaN/GaN modulation doped field-effect transistors", Appl. Phys. Lett., vol. 69, No. 25, pp. 3872-3874, Dec. 1996.

(Continued)

*Primary Examiner* — Arnold M Kinkead
(74) *Attorney, Agent, or Firm* — Volpe Koenig

(57) ABSTRACT

An amplifier circuit includes a first amplifier that amplifies a high frequency signal, and a load circuit that changes a load impedance of the first amplifier without being controlled by an external circuit so that a saturation power at a first temperature is higher than a saturation power at a second temperature lower than the first temperature, and an efficiency at the first temperature is lower than an efficiency at the second temperature.

9 Claims, 23 Drawing Sheets

(56) References Cited

OTHER PUBLICATIONS

S. Arulkumaran et al., "High-temperature effects of AlGaN/ GaN high-electron-mobility transistors on sapphire and semi-insulating SiC substrates", Appl. Phys. Lett., vol. 80, No. 12, pp. 2186-2188, Mar. 2002.
"NI AWR Design Environment Load-Pull Simulation Supports the Design of Wideband High-Efficiency PAs", National Instruments, 2015.

* cited by examiner

LOAD IMPEDANCE

LOAD IMPEDANCE

US 12,051,998 B2

AMPLIFIER CIRCUIT

CROSS REFERENCE TO RELATED APPLICATIONS

This application claims priority based on Japanese Patent Application No. 2021-107629 filed on Jun. 29, 2021, and the entire contents of the Japanese patent applications are incorporated herein by reference.

FIELD

The present disclosure relates to an amplifier circuit, for example, an amplifier circuit having a load circuit.

BACKGROUND

A power amplifier circuit is used in a base station for mobile communication. There is known an amplification circuit capable of changing a load impedance of an amplifier (for example, Patent Document 1: Japanese National Publication of International Patent Application No. 2017-529747, Patent Document 2: International Publication Pamphlet No. 2006/006244). It is known to provide a temperature compensation circuit for compensating for a temperature change in the characteristics of an amplifier circuit (for example, Patent Document 3: Japanese Laid-open Patent Publication No. 2003-37448, Patent Document 4: Japanese Laid-open Patent Publication No. 2005-269351).

SUMMARY

An amplifier circuit according to the present disclosure includes: a first amplifier that amplifies a high frequency signal; and a load circuit that changes a load impedance of the first amplifier without being controlled by an external circuit so that a saturation power at a first temperature is higher than a saturation power at a second temperature lower than the first temperature, and an efficiency at the first temperature is lower than an efficiency at the second temperature.

DETAILED DESCRIPTION OF EMBODIMENTS

Figure 1:
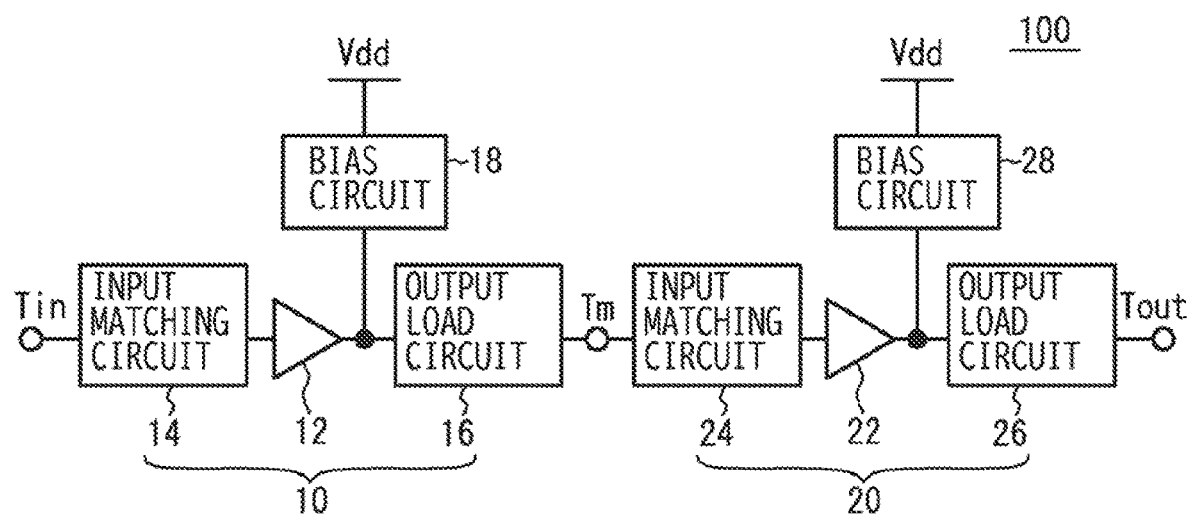
FIG. 1 is a block diagram of an amplifier circuit according to a first embodiment.

When the temperature changes, the temperature characteristics of the amplifier change. When the temperature compensation circuit is provided as in Patent Documents 3 and 4, the amplifier circuit becomes large. It is conceivable to compensate the temperature by changing the load impedance, but when the load impedance is controlled from an external circuit, the amplifier circuit becomes large.

It is an object of the present disclosure to provide an amplifier circuit that enables temperature compensation using a small circuit.

DESCRIPTION OF EMBODIMENTS OF THE PRESENT DISCLOSURE

First, the contents of the embodiments of this disclosure are listed and explained.

(1) An amplifier circuit according to the present disclosure includes: a first amplifier that amplifies a high frequency signal; and a load circuit that changes a load impedance of the first amplifier without being controlled by an external circuit so that a saturation power at a first temperature is higher than a saturation power at a second temperature lower than the first temperature, and an efficiency at the first temperature is lower than an efficiency at the second temperature. This makes it possible to provide an amplifier circuit that enables temperature compensation using a small circuit.

(2) The load circuit may include a reactance element, and a resistance element having a first resistance value at the first temperature and a second resistance value at the second temperature different from each other.

(3) The reactance element may be connected in series between the first amplifier and an output terminal, and the resistor element may be connected in parallel with the reactance element between the first amplifier and the output terminal.

(4) The load impedance may be inductive, and a resistive component of the load impedance at the first temperature may be higher than a resistive component of the load impedance at the second temperature.

(5) The reactance element may be a capacitive element, and the first resistance value may be lower than the second resistance value.

(6) The resistive element may be a thermistor.

(7) The amplifier circuit further may include: a transistor that has a first terminal connected to a first end of the reactance element and a second terminal connected to a second end of the reactance element, and is the resistance element; and an adjustment circuit that makes a voltage of a control terminal of the transistor different between the first temperature and the second temperature.

(8) The amplifier circuit further may include: a diode that is connected in parallel with the reactance element and is the resistance element; and an adjustment circuit that makes a voltage difference across both ends of the diode different between the first temperature and the second temperature.

(9) The first amplifier may be a GaN HEMT.

(10) The amplifier circuit further may include a second amplifier that amplifies an output signal of the first amplifier.

DETAILS OF EMBODIMENTS OF THE PRESENT DISCLOSURE

Specific examples of the amplifier circuit in accordance with embodiments of the present disclosure are described below with reference to the drawings. The present disclosure is not limited to these examples, but is indicated by the claims, which are intended to include all modifications within the meaning and scope of the claims.

First Embodiment

As a first embodiment, a two-stage amplifier circuit will be described as an example. FIG. 1 is a block diagram of the amplifier circuit according to the first embodiment. As illustrated in FIG. 1, an amplifier circuit 100 includes a pre-stage amplifier circuit 10 and a post-stage amplifier circuit 20. The pre-stage amplifier circuit 10 includes an amplifier 12, an input matching circuit 14, an output load circuit 16, and a bias circuit 18. The post-stage amplifier circuit 20 includes an amplifier 22, an input matching circuit 24, an output load circuit 26, and a bias circuit 28. The pre-stage amplifier circuit 10 amplifies a high frequency signal input to an input terminal Tin and outputs it to a terminal Tm. The post-stage amplifier circuit 20 amplifies the high frequency signal amplified by the pre-stage amplifier circuit 10 and input to the terminal Tm, and outputs the high frequency signal to the output terminal Tout. The amplifier circuit 100 is a power amplifier circuit used in a base station for mobile communication such as 5G (5th Generation Mobile Communication System).

The amplifiers 12 and 22 are transistors such as FETs (Field Effect Transistors), and are, for example, GaN HEMT (Gallium Nitride High Electron Mobility Transistor) or LDMOS (Laterally Diffused Metal Extract). The GaN HEMT is, for example, a HEMT having a GaN channel layer and an AlGaN barrier layer. The input terminals of the amplifiers 12 and 22 are, for example, the gates of the FETs, and the output terminals are, for example, the drains of the FETs.

The input matching circuit 14 matches an input impedance of the input terminal Tin to an input impedance of the amplifier 12. The output load circuit 16 is a circuit that sets a load impedance of the amplifier 12. The load impedance is an impedance when the output load circuit 16 is viewed from the output terminal (drain) of the amplifier 12. In the first embodiment, the load impedance of the output load circuit 16 changes depending on the temperature. The bias circuit 18 supplies a bias voltage Vdd to the output terminal of the amplifier 12. The input matching circuit 24 matches the impedance of the output load circuit 16 with an input impedance of the amplifier 22. The output load circuit 26 is a circuit that sets a load impedance of the amplifier 22. In the first embodiment, the load impedance set by the output load circuit 26 is fixed regardless of the temperature. The bias circuit 28 supplies the bias voltage Vdd to the output terminal of the amplifier 12. The pre-stage amplifier circuit 10 and the post-stage amplifier circuit 20 may include bias circuits that supply the bias voltages to the input terminals of the amplifiers 12 and 22, respectively.

First Comparative Example

As a first comparative example, a problem when the load impedance of the output load circuit 16 as viewed from the output terminal of the amplifier 12 is fixed will be described using the GaN HEMTs as the amplifiers 12 and 22. In the power amplification circuit for a base station, the load impedance is set so that the output load circuit 26 of the post-stage amplifier circuit 20 has a high efficiency. The characteristics of the post-stage amplifier circuit 20 at 3.5 GHz in an amplifier circuit having an output power of a 300 W class are illustrated.

Figure 2:
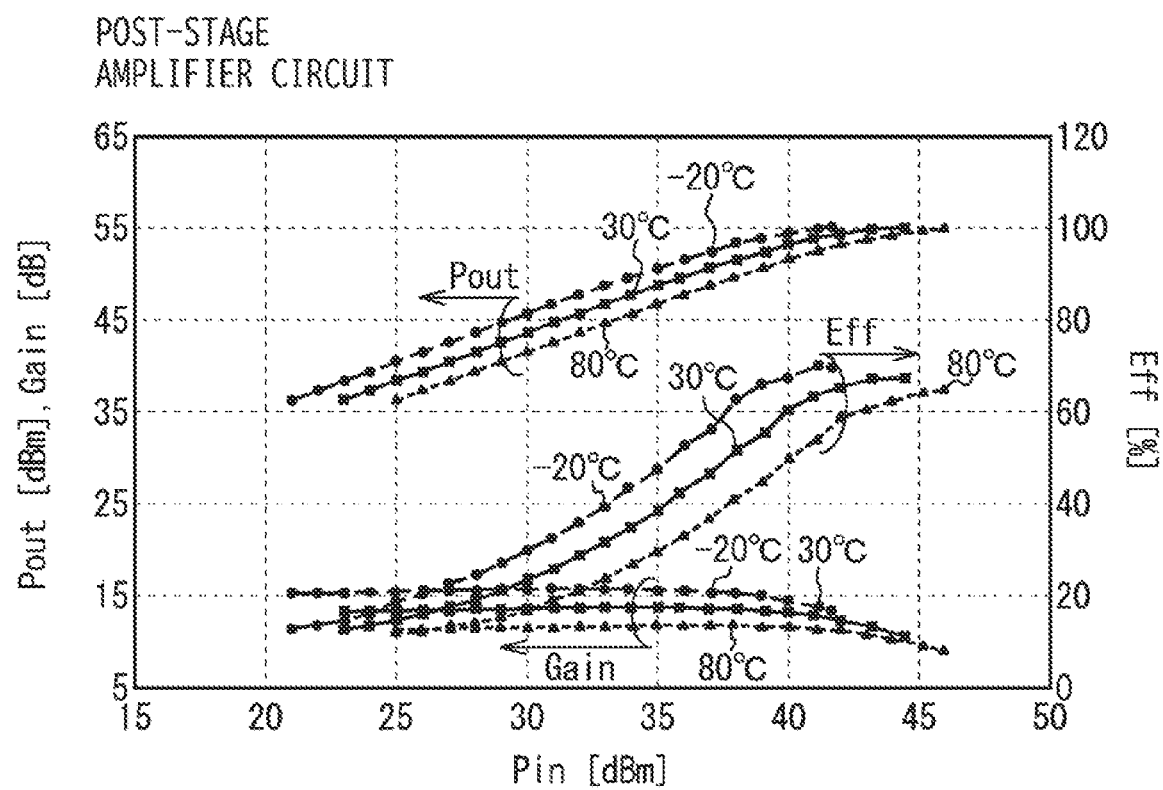
FIG. 2 is a diagram illustrating input/output characteristics when the temperature in a post-stage amplifier circuit is changed.

FIG. 2 is a diagram illustrating input/output characteristics when the temperature in the post-stage amplifier circuit is changed. In FIG. 2, a horizontal axis represents an input power Pin, a vertical axis represents an output power Pout, a power gain Gain, and a power addition efficiency Eff. Temperatures are −20 C.°, 30° C. and 80° C. As illustrated in FIG. 2, as the temperature increases, the output power Pout, the power gain Gain and the power addition efficiency Eff decrease. This is because the velocity and the mobility of the electrons in a high electric field of a channel layer of the GaN HEMT decrease as the temperature increase.

In a 300 W-class amplifier circuit, when a signal having a peak-to-average power ratio (PAPR) of 10 dB is amplified, a modulated wave output of the post-stage amplifier circuit 20 is 45 dBm (about 30 W), and a peak output is 55 dBm (about 300 W). At 80° C., the power gain Gain is about 9 dBm when the output power Pout is 55 dBm. Therefore, the output signal (signal at the terminal Tm) of the pre-stage amplifier circuit 10 should have a saturation power Psat of 46 dBm and a modulated wave output of 36 dBm. Similarly, at 30° C., the power gain Gain is about 11 dBm when the output power Pout is 55 dBm. Therefore, the saturation power Psat and the modulated wave output of the pre-stage amplifier circuit 10 should be 44 dBm and 34 dBm, respectively. At −20° C., the power gain Gain is about 13 dBm when the output power Pout is 55 dBm. Therefore, the saturation power Psat and the modulated wave output of the pre-stage amplifier circuit 10 should be 42 dBm and 32 dBm, respectively.

Figure 3:
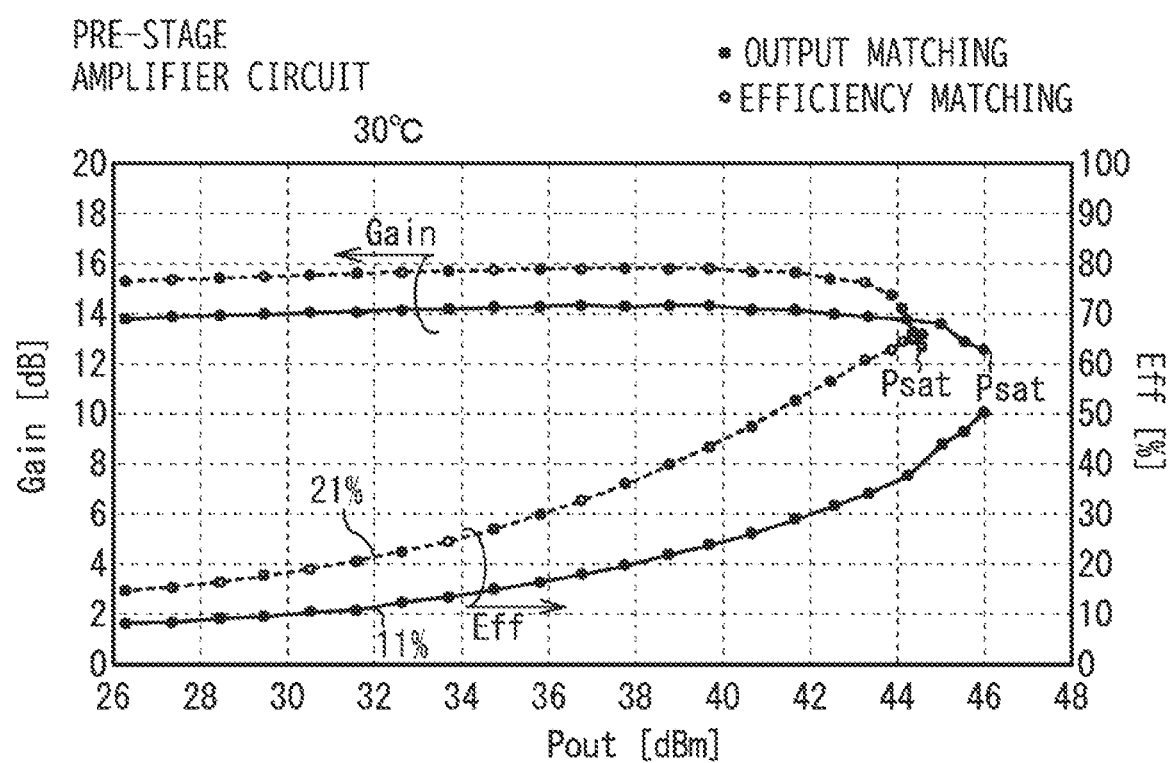
FIG. 3 is a diagram illustrating input/output characteristics in a pre-stage amplifier circuit.

FIG. 3 is a diagram illustrating input/output characteristics in the pre-stage amplifier circuit. In FIG. 3, a horizontal axis represents an output power Pout, and a vertical axis represents the power gain Gain and the power addition efficiency Eff. The temperature is 30° C. Black circles represent the input/output characteristics when the load impedance is set so that the saturation power Psat is higher (this is called output matching). White circles represent the input/output characteristics when the load impedance of the output load circuit 16 is set so that the power addition efficiency Eff at an operating point of 32 dBm is higher (this is called efficiency matching). As illustrated in FIG. 3, in the output matching, the saturation power Psat is about 46 dBm and the efficiency Eff at 32 dBm is about 11%. In the efficiency matching, the saturation power Psat is about 44.5 dBm and the efficiency Eff at 32 dBm is about 21%. Thus, in the efficiency matching, the efficiency Eff of the pre-stage amplifier circuit 10 is higher, but the saturation power Psat is smaller. In output matching, the saturation power Psat of the pre-stage amplifier circuit 10 is larger, but the efficiency Eff is lower.

When the temperature is 80° C., the saturation power Psat of the pre-stage amplifier circuit 10 is required to be 46 dBm. Therefore, the output matching of the load impedance of the pre-stage amplifier circuit 10 is executed. On the other hand, when the temperature is 30° C., the output power Pout of the pre-stage amplifier circuit 10 should be 44 dBm. However, when the output load circuit 16 is fixed as in the first comparative example, the load impedance of the output load circuit 16 is fixed to the output matching. Therefore, when the operating point is 32 dBm, the efficiency Eff of the pre-stage amplifier circuit 10 is 11%. As described above, since the load impedance of the output load circuit 16 is set so as to be the output matching in the first comparative example, the efficiency deteriorates when the temperature is low. Here, by increasing the size of the amplifier 12 in the pre-stage amplifier circuit 10, the saturation power Psat can be set to 46 dBm. However, in this case, the pre-stage amplifier circuit 10 becomes larger.

Figure 4:
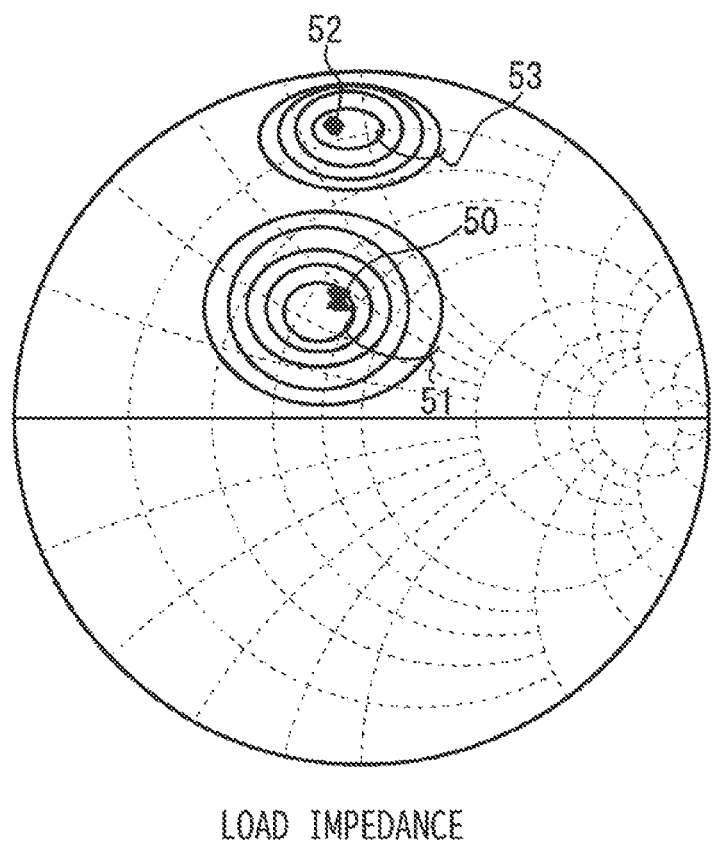
FIG. 4 is a Smith chart illustrating a load impedance in the pre-stage amplifier circuit.

FIG. 4 is a Smith chart illustrating a load impedance in the pre-stage amplifier circuit. In FIG. 4, a standard impedance is 50Ω. An impedance 50 is a load impedance of 3.4 GHz to 3.6 GHz at the time of the output matching, and the saturation power Psat is 46 dBm. Curves 51 surrounding the impedance 50 are contour lines of the saturation power Psat, and the saturation power Psat decreases by each 0.5 dBm toward an outermost curve. An impedance 52 is a load impedance of 3.4 GHz to 3.6 GHz at the time of the efficiency matching, and the efficiency Eff is 30%. The curves 53 surrounding the impedance 52 is contour lines of the efficiency Eff, and the efficiency Eff decreases by each 3% toward an outermost curve. The impedance 50 is about 0.4+0.24j (j is an imaginary unit). The impedance 52 is about 0.2+0.18j. In this way, the reactance components of both the impedances 50 and 52 are positive (inductive), and the impedance 50 has a higher resistance component than the impedance 52. The impedance 50 has a smaller reactance component/resistance component than the impedance 52.

(Output Load Circuit of First Embodiment)

In the output load circuit 16 of the pre-stage amplifier circuit 10 of the first embodiment, regardless of the control from the external circuit, the load impedance becomes around the impedance 50 at a high temperature (for example, 80° C.), and the load impedance becomes around the impedance 52 at a low temperature (for example, 30° C.). Thereby, at 80° C., the saturation power Psat of the pre-stage amplifier circuit 10 can be set to 46 dBm as indicated by the output matching in FIG. 3. On the other hand, at low temperature, the saturation power Psat of the pre-stage amplifier circuit 10 becomes small as indicated by the efficiency matching in FIG. 3, but the required 44 dBm is obtained. Moreover, the efficiency at 32 dBm which is the operating point can be set to 21%. Thereby, the power consumption can be reduced by 7 W.

Figure 5:
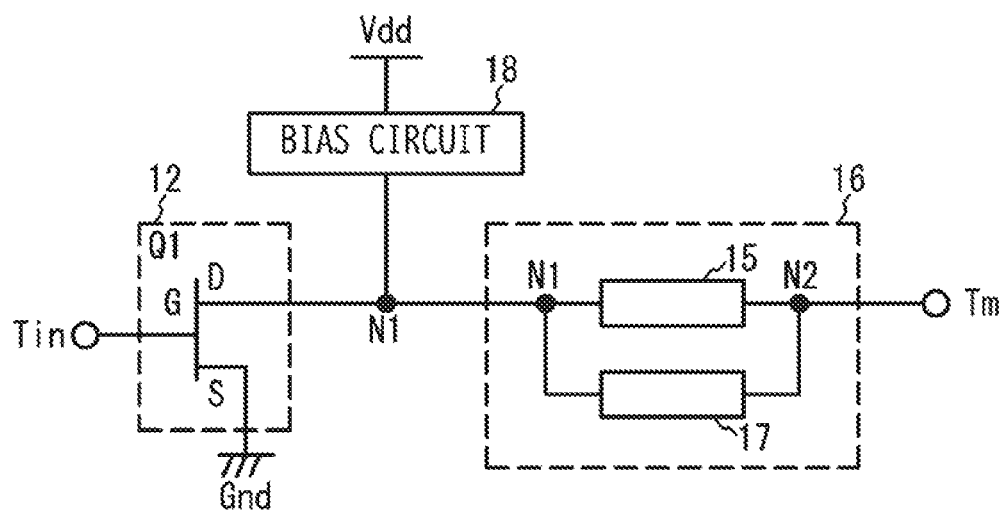
FIG. 5 is a circuit diagram of a pre-stage amplifier circuit according to the first embodiment.

FIG. 5 is a circuit diagram of the pre-stage amplifier circuit according to the first embodiment. In FIG. 5, the input matching circuit is omitted. As illustrated in FIG. 5, the amplifier 12 is a FET Q1, the source S of the FET Q1 is connected to the ground Gnd, the gate G of the FET Q1 is connected to the input terminal Tin, and the drain D of the FET Q1 is connected to the node N1. The bias circuit 18 is connected to the node N1. The output load circuit 16 includes a reactance element 15 connected in series between the nodes N1 and N2, and a resistance element 17 connected in parallel with the reactance element 15 between the nodes N1 and N2.

The reactance element 15 is an element whose impedance is mainly a reactance component, and is, for example, a capacitive element such as a capacitor or an inductive element such as an inductor. The resistance element 17 is an element whose impedance is mainly a resistance component. The reactance of the reactance element 15 has a small temperature dependence, and the resistance of the resistance element 17 has a very large temperature dependence. For example, a temperature coefficient of an absolute value of the impedance of the resistance element 17 is larger than a temperature coefficient of an absolute value of the impedance of the reactance element 15 at an operating frequency, and is 10 times or more. The load impedance can be changed with temperature by changing the resistance value of the resistance element 17 with temperature. In order to change the load impedance with temperature, the reactance of the reactance element 15 may be changed with temperature. However, it is easier to change the resistance value of the resistance element 17 with temperature than to change the reactance of the reactance element 15 with temperature.

Hereinafter, an example of the output load circuit 16 will be described in variations of the first embodiment.

First Variation of First Embodiment

Figure 6:
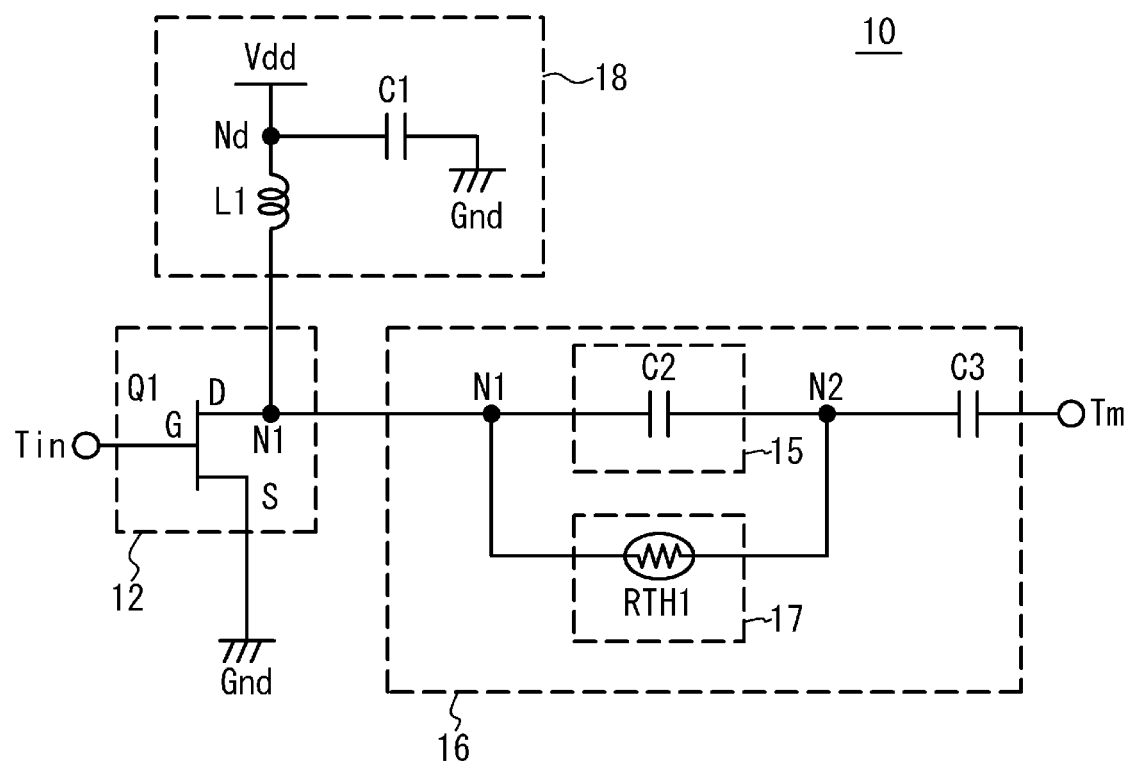
FIG. 6 is a circuit diagram of a pre-stage amplifier circuit according to a first variation of the first embodiment.

FIG. 6 is a circuit diagram of a pre-stage amplifier circuit according to a first variation of the first embodiment. In FIG. 6, the input matching circuit is omitted. As illustrated in FIG. 6, the bias circuit 18 includes the inductor L1 and the capacitor C1. The inductor L1 is connected between the nodes N1 and Nd. The capacitor C1 is connected between the node Nd and the ground Gnd. A drain bias voltage Vdd is applied to the node N1. The inductor L1 is a choke coil for cutting high frequency signals and for matching. The capacitor C1 is a capacitor for bias.

The output load circuit 16 includes capacitors C2, C3 and a thermistor RTH1. The capacitor C2 is the reactance element 15 and is connected between the nodes N1 and N2. The capacitor C3 is connected between the node N2 and the terminal Tm. The thermistor RTH1 is the resistance element 17, and is connected in parallel with the capacitor C2 between the nodes N1 and N2. The capacitor C2 is for matching, and the capacitor C3 is for DC cutting. Thermistor RTH1 has NTC (Negative Temperature Coefficient), and has a low resistance value as the temperature increases.

Figure 7:
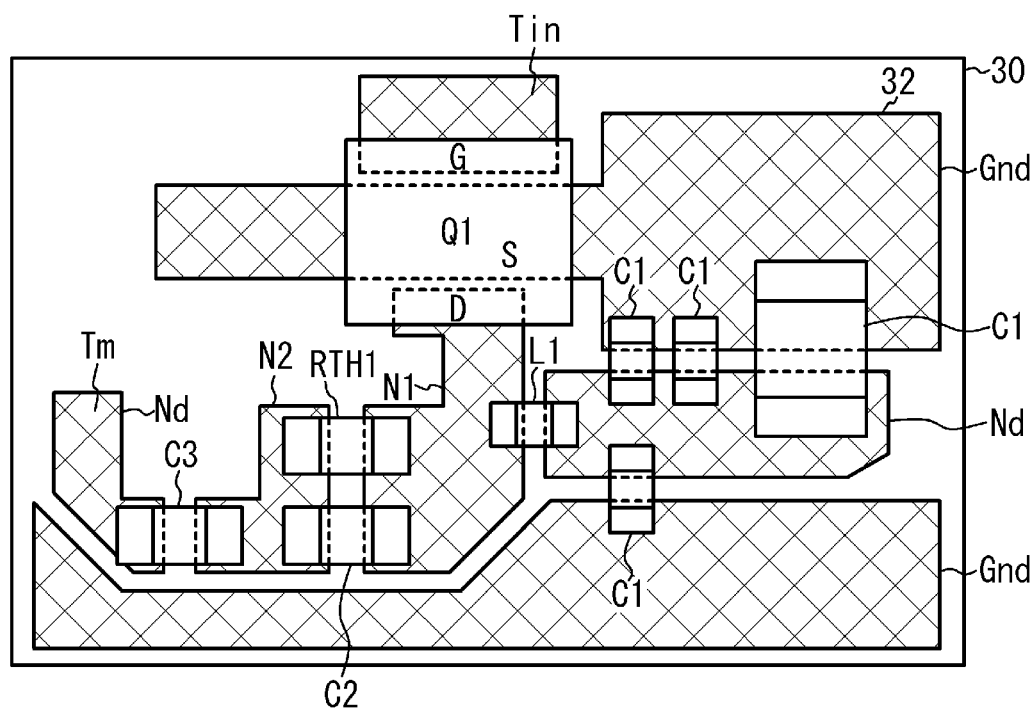
FIG. 7 is a plan view of the pre-stage amplifier circuit according to the first variation of the first embodiment.

FIG. 7 is a plan view of the pre-stage amplifier circuit according to the first variation of the first embodiment. In FIG. 7, the input matching circuit 14 and the post-stage amplifier circuit 20 are omitted. A conductor pattern 32 is illustrated by hatching. As illustrated in FIG. 7, the conductor pattern 32 is provided on a dielectric substrate 30. The dielectric substrate 30 is, for example, a resin substrate such as FR-4 or a ceramic substrate. The conductor pattern 32 is a metal layer such as Cu or Au. A package which is FET Q1, chip capacitors which are capacitors C1 to C3, a chip inductor which is the inductor L1, and the thermistor RTH1 are mounted on the dielectric substrate 30. The conductor pattern 32 corresponds to the ground Gnd, the input terminal Tin, the terminal Tm, and the nodes N1, N2 and Nd.

The load impedance when the terminal Tm was viewed from the drain D of the FET Q1 was simulated. The simulation conditions are as follows.

Figure 8:
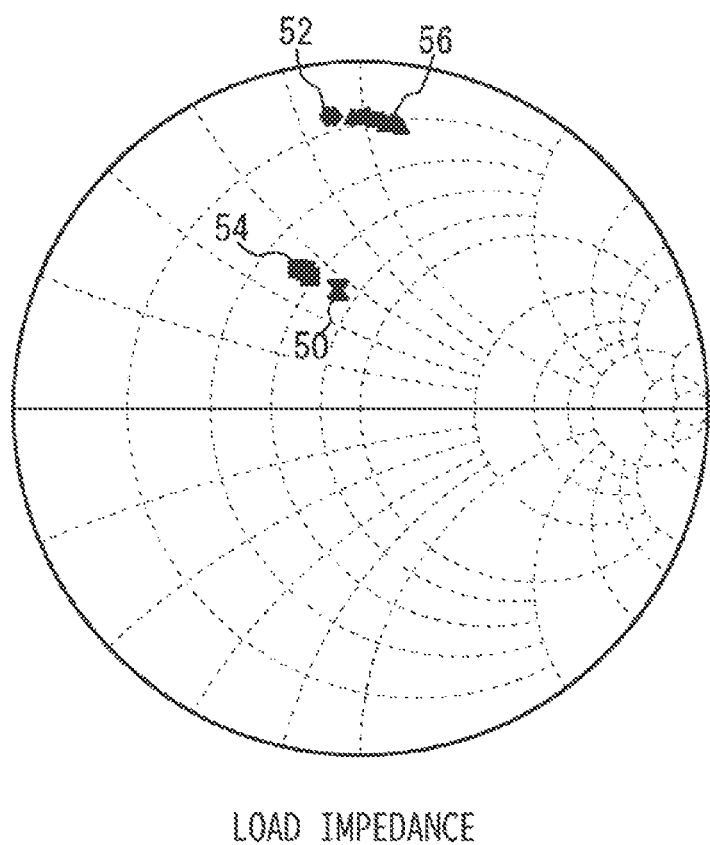
FIG. 8 is a diagram illustrating a load impedance of an output load circuit in the first variation of the first embodiment.

Capacitor C1: 4 pF
Capacitor C2: 0.2 pF
Capacitor C3: 4 pF
Inductor L1: 1.2 nH
Thermistor RTH 1: 220Ω at 25° C., 20Ω at 100° C.
FET Q1: GaN HEMT FIG. 8 is a diagram illustrating a load impedance of the output load circuit in the first variation of the first embodiment. As illustrated in FIG. 8, an impedance 54 is a load impedance at a temperature of 100° C., and an impedance 56 is a load impedance at a temperature of 25° C. The frequency is set to 3.4 GHz to 3.6 GHz. The load impedance is the impedance 54 close to the impedance 50 of the output matching at 100° C., and the impedance 56 close to the impedance 52 of the efficiency matching at 25° C.

Second Variation of First Embodiment

Figure 9:
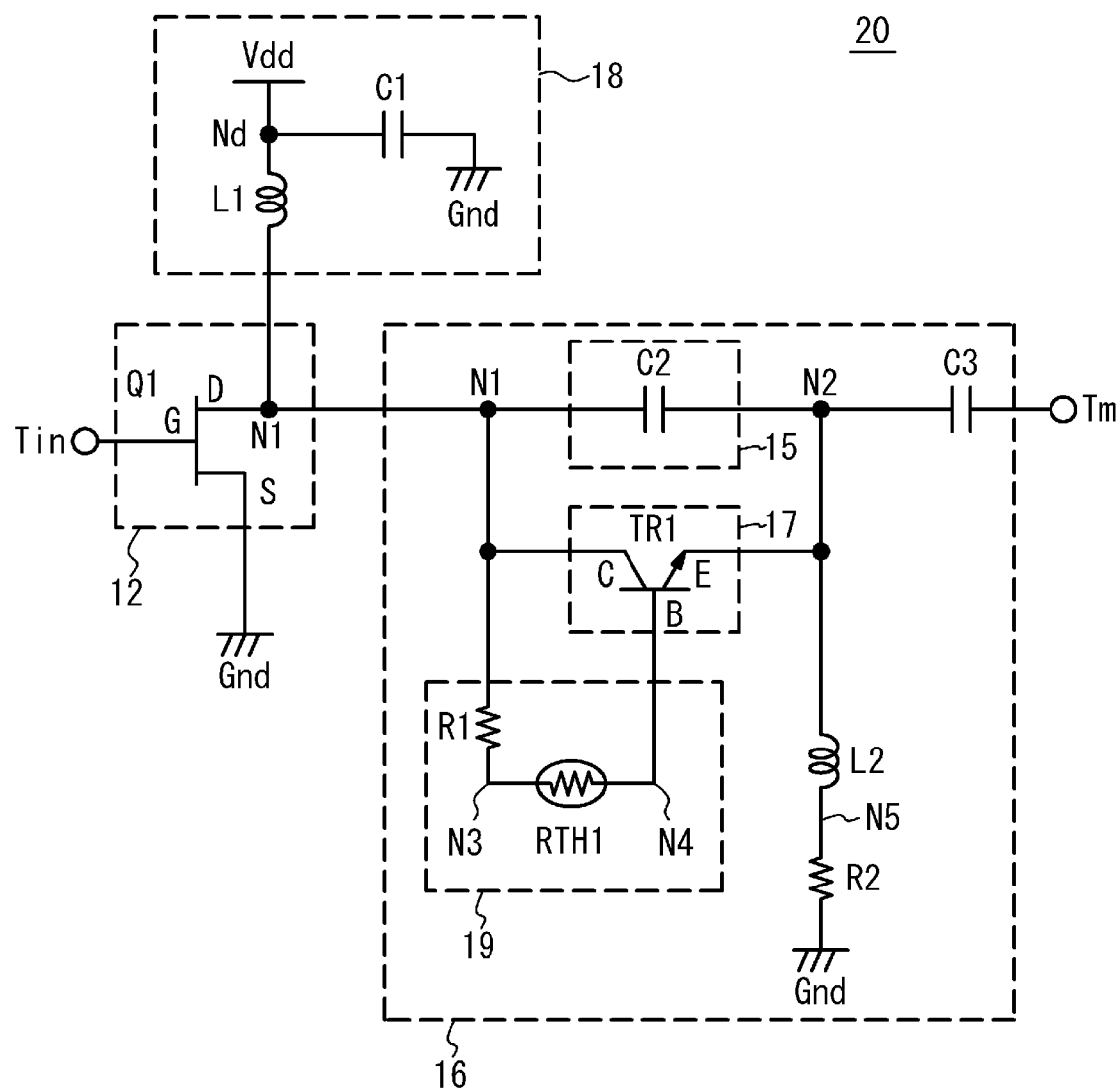
FIG. 9 is a circuit diagram of a pre-stage amplifier circuit according to a second variation of the first embodiment.

FIG. 9 is a circuit diagram of a pre-stage amplifier circuit according to a second variation of the first embodiment. As illustrated in FIG. 9, the output load circuit 16 includes the transistor TR1, the inductor L2, the resistors R1 and R2, the capacitors C2 and C3, and the thermistor RTH1. The transistor TR1 is the resistance element 17 and is an NPN bipolar transistor. An emitter E of the transistor TR1 is connected to the node N2, a collector C of the transistor TR1 is connected to the node N1, and a base B of the transistor TR1 is connected to the node N1 via the thermistor RTH1 and the resistor R1. An adjustment circuit 19 has the thermistor RTH1 and the resistor R1 and adjusts a base voltage of the transistor TR1. A node between the thermistor RTH1 and the resistance R1 is N3, and a node between the thermistor RTH1 and the base B is N4. The node N2 is connected to the ground via the inductor L2 and the resistor R2. A node between the inductor L2 and the resistor R2 is N5. The inductor L2 and the resistor R2 are a bias circuit for supplying an emitter-bias voltage of the transistor TR1, the resistor R2 is a bias resistor, and the inductor L2 is a choke coil for cutting the high frequency signal.

The collector-bias voltage of the transistor TR1 is the voltage of the node N1 and is higher than the emitter-bias voltage (voltage of the node N2). When the temperature is high, the resistance value of the thermistor RTH1 becomes low and the base voltage of the transistor TR1 becomes high. Therefore, a resistance between the emitter and the collector of the transistor TR1 becomes low. When the temperature is low, the resistance value of the thermistor RTH1 becomes high and the base voltage of the transistor TR1 becomes low. Therefore, the resistance between the emitter and the collector of the transistor TR1 becomes high. Other configurations are the same as those in FIG. 6 of the first variation of the first embodiment, and the description thereof will be omitted.

Figure 10:
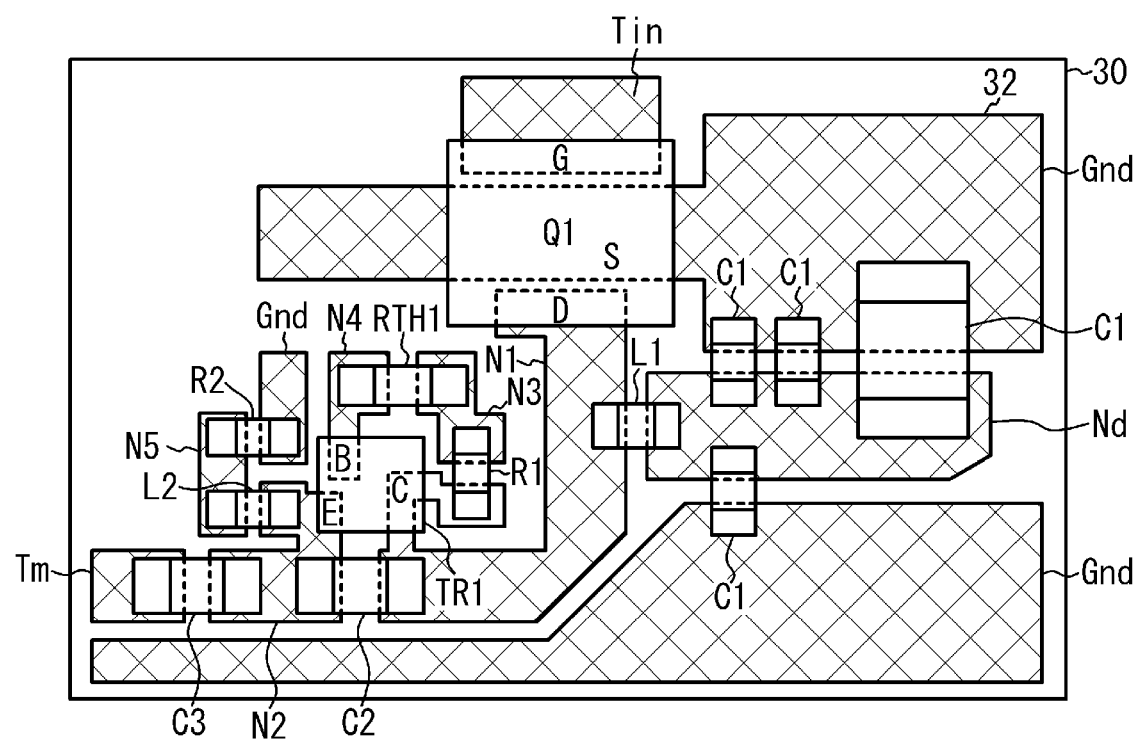
FIG. 10 is a plan view of the pre-stage amplifier circuit according to the second variation of the first embodiment.

FIG. 10 is a plan view of the pre-stage amplifier circuit according to the second variation of the first embodiment. As illustrated in FIG. 10, a package which is the FET Q1 and the transistor TR1, the chip capacitors which are capacitors C1 to C3, chip inductors which are inductors L1 and L2, chip resistors which are resistors R1 and R, and the thermistor RTH1 are mounted on the dielectric substrate 30. A conductor pattern 32 corresponds to the ground Gnd, the input terminal Tin, the terminal Tm, and the nodes N1 to N5 and Nd. Other configurations are the same as those in FIG. 7 of the first variation of the first embodiment, and the description thereof will be omitted.

The load impedance when the terminal Tm was viewed from the drain D of the FET Q1 was simulated. The simulation conditions are as follows.

Figure 11:
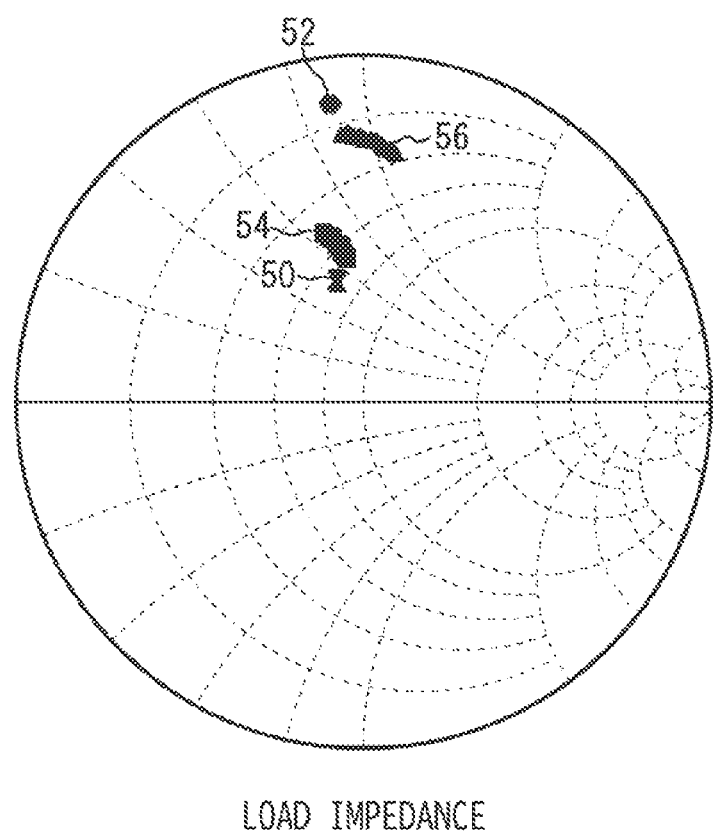
FIG. 11 is a diagram illustrating a load impedance of an output load circuit in the second variation of the first embodiment.

Capacitor C1: 4 pF
Capacitor C2: 0.35 pF
Capacitor C3: 4 pF
Inductor L1: 1.1 nH
Inductor L2: 12 nH
Resistors R1: 0 Ω
Resistors R2: 33 kΩ
Thermistor RTH 1: 220Ω at 25° C., 20Ω at 100° C.
Transistor TR1: NPN transistor
FET Q1: GaN HEMT FIG. 11 is a diagram illustrating a load impedance of the output load circuit in the second variation of the first embodiment. As illustrated in FIG. 11, the impedance 54 is the load impedance at a temperature of 100° C., and the impedance 56 is the load impedance at a temperature of 25° C. The frequency is set to 3.4 GHz to 3.6 GHz. The load impedance is the impedance 54 close to the impedance 50 of the output matching at 100° C., and the impedance 56 close to the impedance 52 of the efficiency matching at 25° C. Thus, in the second variation of the first embodiment, the transistor is used as the resistance element 17. Thereby, the change in the resistance value of the resistance element 17 due to the change in temperature can be increased, as compared with the first variation of the first embodiment in which the thermistor RTH1 is used for the resistance element 17. Further, the accuracy of the change in the resistance value of the resistance element 17 due to the change in temperature can be improved, as compared with a third variation of the first embodiment in which a diode D1 is used for the resistance element 17 described later.

Third Variation of First Embodiment

Figure 12:
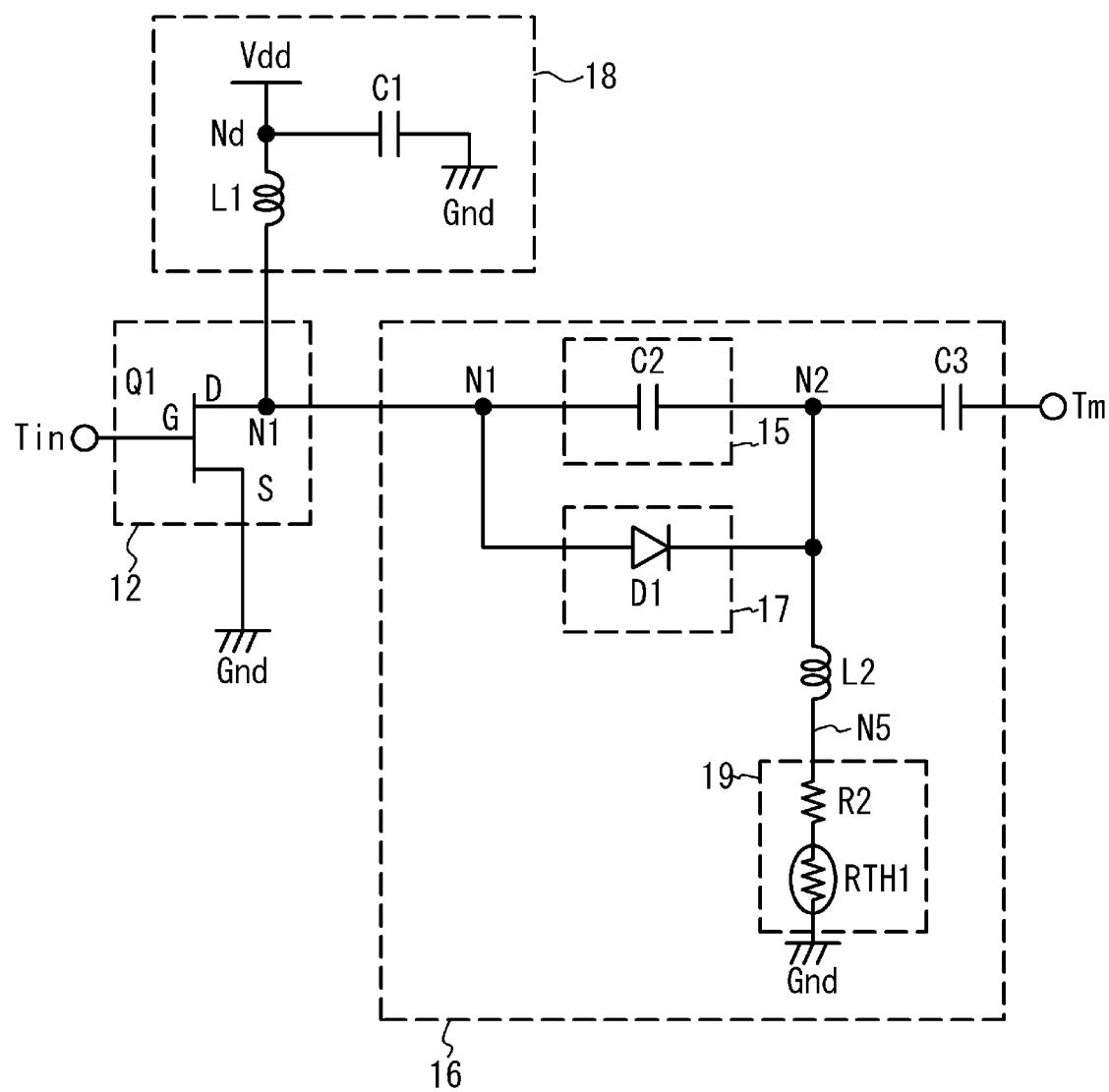
FIG. 12 is a circuit diagram of a pre-stage amplifier circuit according to a third variation of the first embodiment.

FIG. 12 is a circuit diagram of a pre-stage amplifier circuit according to a third variation of the first embodiment. As illustrated in FIG. 12, the output load circuit 16 includes the diode D1, the inductor L2, the resistor R2, the capacitors C2, C3, and the thermistor RTH1. The diode D1 is the resistance element 17. An anode of the diode D1 is connected to the node N1 and a cathode of the diode D1 is connected to the node N2. The node N2 is connected to the ground via the inductor L2, the resistor R2 and the thermistor RTH1. The adjustment circuit 19 has the resistance R2 and the thermistor RTH1, and adjusts a voltage difference across both ends of the diode D1. When the temperature is high, the resistance value of the thermistor RTH1 becomes low, and the voltage difference between the nodes N1 and N2 becomes large. The diode D1 is connected in a forward direction. When the voltage difference between the nodes N1 and N2 becomes large, a current flowing through the diode D1 rapidly increases. Thereby, the resistance value of the diode D1 becomes low. When the temperature is low, the resistance value of the thermistor RTH1 becomes high, and the voltage difference between the nodes N1 and N2 becomes small. Thereby, the resistance value of the diode D1 becomes high. Therefore, the diode D1 can be used as the resistance element 17. By using the diode D1 as the resistance element 17, the resistance element 17 can be realized at a low cost, as compared with the second variation of the first embodiment in which the transistor is used for the resistance element 17. Further, the change in the resistance value of the resistance element 17 due to the change in temperature can be increased, as compared with the first variation of the first embodiment in which the thermistor RTH1 is used for the resistance element 17. Other configurations are the same as those in FIG. 9 of the second variation of the first embodiment, and the description thereof will be omitted.

Fourth Variation of First Embodiment

Figure 13:
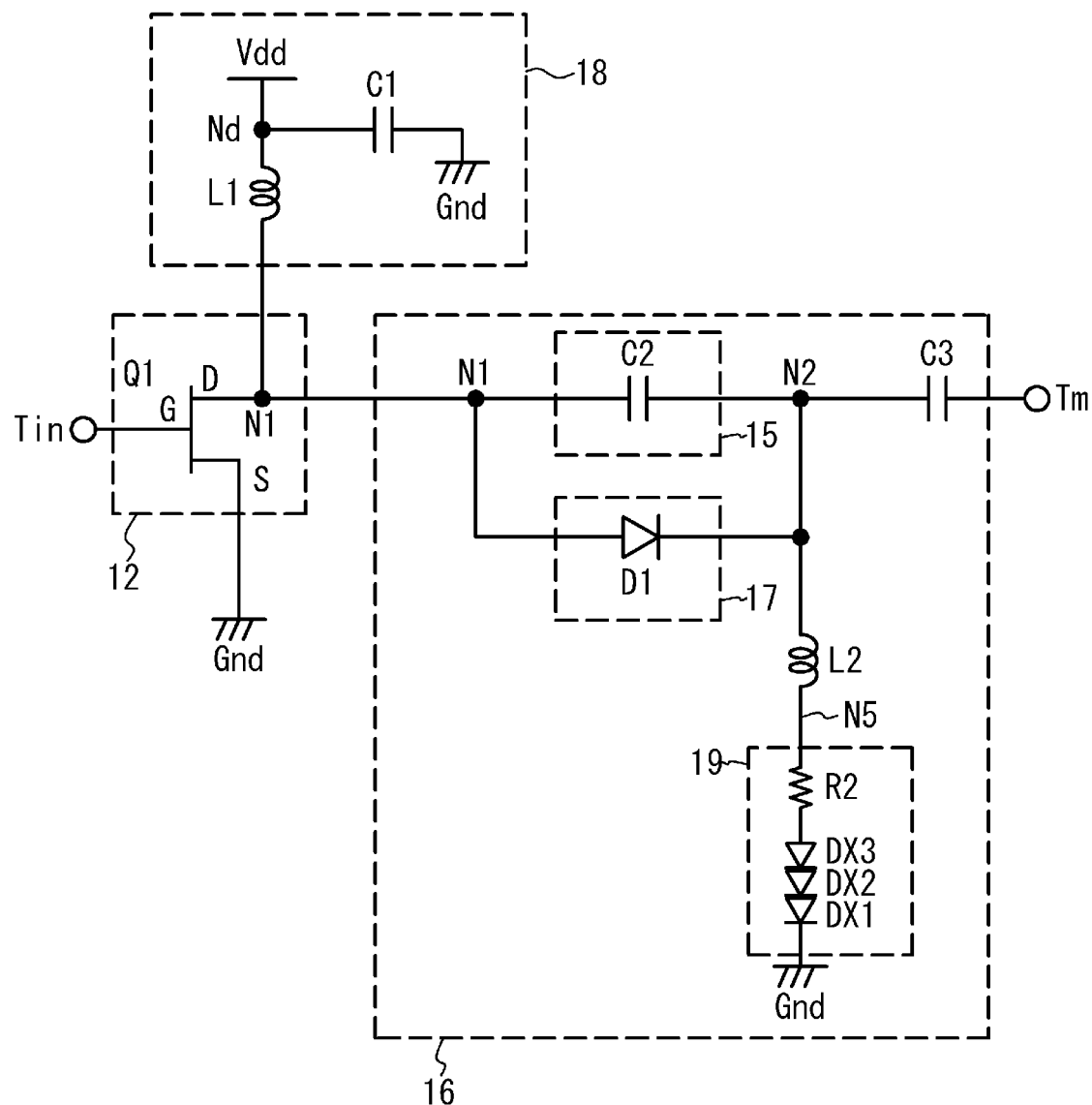
FIG. 13 is a circuit diagram of a pre-stage amplifier circuit according to a fourth variation of the first embodiment.

FIG. 13 is a circuit diagram of a pre-stage amplifier circuit according to a fourth variation of the first embodiment. As illustrated in FIG. 13, the output load circuit 16 includes the diodes D1 and DX1 to DX3, the inductor L2, the resistor R2, and the capacitors C2 and C3. In the fourth variation of the first embodiment, the thermistor RTH1 of the third variation of the first embodiment is replaced with the plurality of diodes DX1 to DX3. The adjustment circuit 19 has the resistor R2 and the diodes DX1 to DX3. The diodes DX1 to DX3 are connected in series in the forward direction. When the temperature becomes high, a forward current of the diodes DX1 to DX3 rapidly increases, and the resistance values of the diodes DX1 to DX3 become low. When the temperature becomes low, the forward current of the diodes DX1 to DX3 becomes small, and the resistance values of the diodes DX1 to DX3 become high. Therefore, the diodes DX1 to DX3 operate in the same manner as the thermistor RTH1 of the third variation of the first embodiment. As compared with the third variation of the first embodiment using the thermistor RTH1, the pre-stage amplifier circuit can be realized at a lower cost. Other configurations are the same as those in FIG. 12 of the third variation of the first embodiment, and the description thereof will be omitted.

Fifth Variation of First Embodiment

Figure 14:
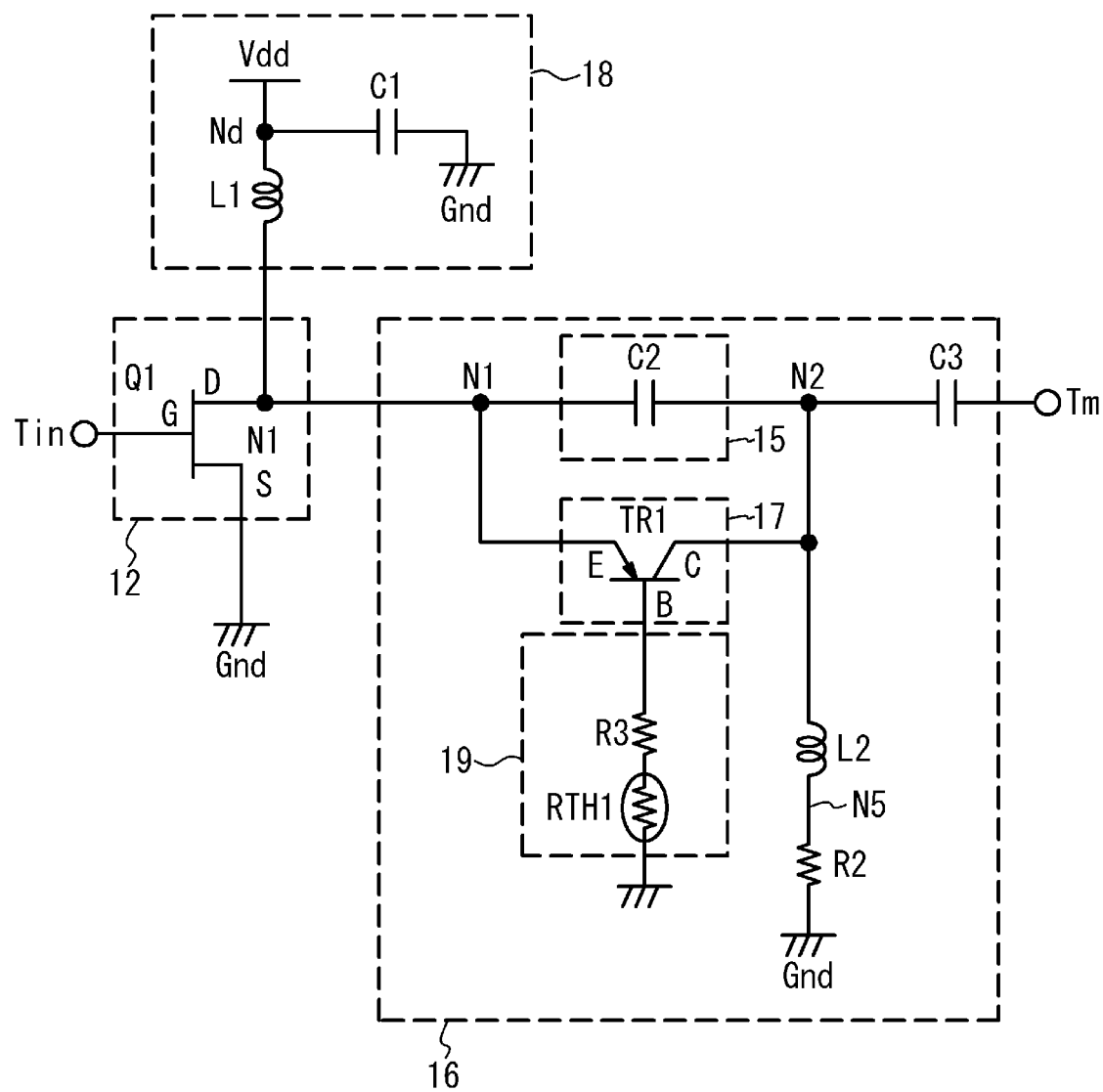
FIG. 14 is a circuit diagram of a pre-stage amplifier circuit according to a fifth variation of the first embodiment.

FIG. 14 is a circuit diagram of a pre-stage amplifier circuit according to a fifth variation of the first embodiment. As illustrated in FIG. 14, the output load circuit 16 includes the transistor TR1, the inductor L2, the resistors R2, R3, the capacitors C2, C3, and the thermistor RTH1. The transistor TR1 is the resistance element 17 and is the PNP transistor. The emitter E of the transistor TR1 is connected to the node N1, the collector C of the transistor TR1 is connected to the node N2, and the base B of the transistor TR1 is connected to the ground via the resistor R3 and the thermistor RTH1. The adjustment circuit 19 has the resistance R3 and the thermistor RTH1, and adjusts the base voltage of the transistor TR1. When the temperature becomes high, the resistance value of the thermistor RTH1 becomes low, and the base voltage of the transistor TR1 becomes low. Thereby, the resistance value between the emitter and the collector of the transistor TR1 becomes low. When the temperature becomes low, the resistance value of the thermistor RTH1 becomes high, and the base voltage of the transistor TR1 becomes high. Thereby, the resistance value between the emitter and the collector of the transistor TR1 becomes high. Therefore, the transistor TR1 can be used as the resistance element 17. Other configurations are the same as those in FIG. 10 of the second variation of the first embodiment, and the description thereof will be omitted.

Sixth Variation of First Embodiment

Figure 15:
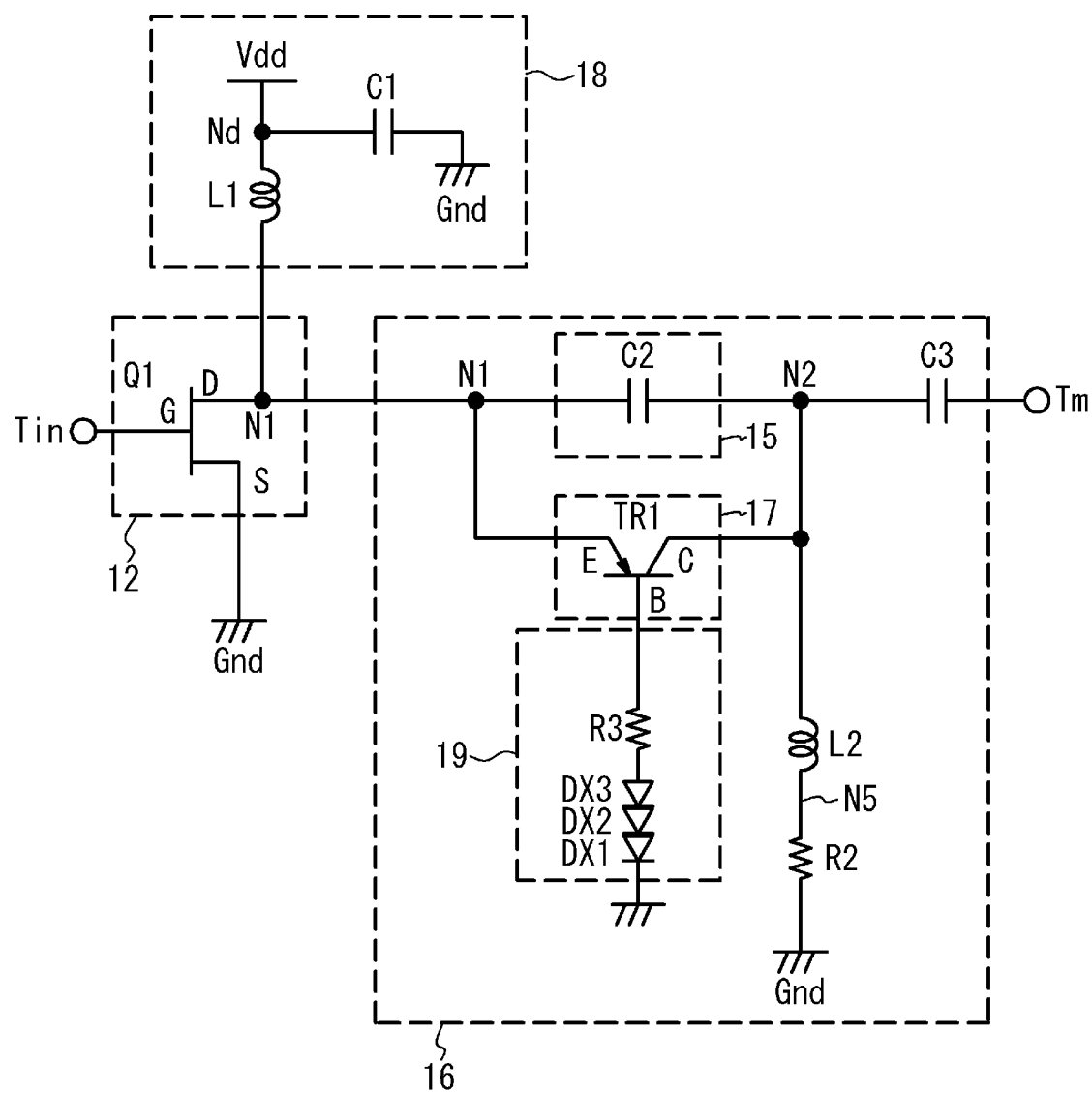
FIG. 15 is a circuit diagram of a pre-stage amplifier circuit according to a sixth variation of the first embodiment.

FIG. 15 is a circuit diagram of a pre-stage amplifier circuit according to a sixth variation of the first embodiment. As illustrated in FIG. 15, the output load circuit 16 includes the transistor TR1, the diodes DX1 to DX3, the inductor L2, the resistors R2 and R3, and the capacitors C2 and C3. In the sixth variation of the first embodiment, the thermistor RTH1 of the fifth variation of the first embodiment is replaced with the plurality of diodes DX1 to DX3 connected in the forward direction. The adjustment circuit 19 has the resistor R3 and the diodes DX1 to DX3. Other configurations are the same as those in FIG. 14 of the fifth variation of the first embodiment, and the description thereof will be omitted.

Seventh Variation of First Embodiment

Figure 16:
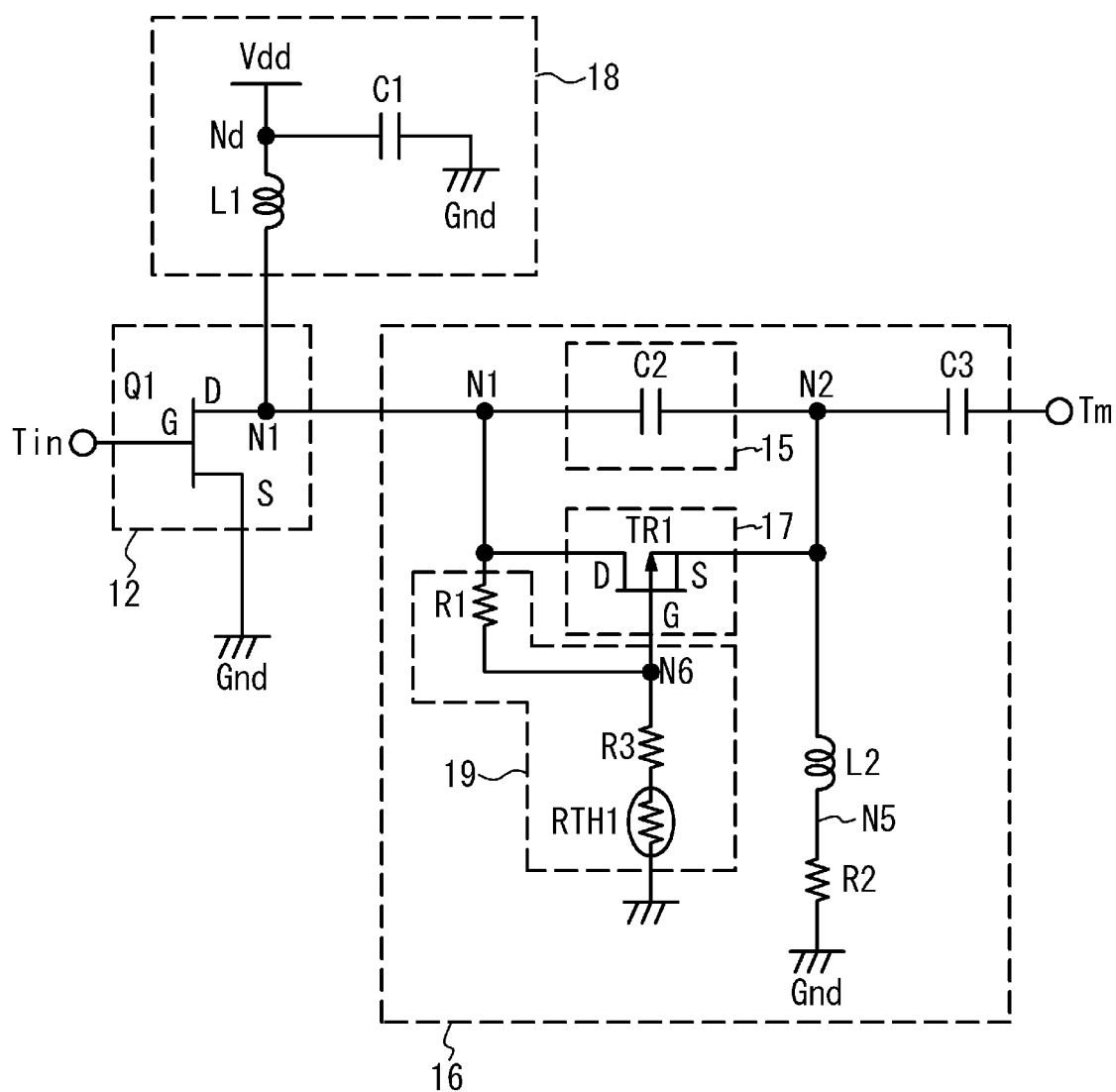
FIG. 16 is a circuit diagram of a pre-stage amplifier circuit according to a seventh variation of the first embodiment.

FIG. 16 is a circuit diagram of a pre-stage amplifier circuit according to a seventh variation of the first embodiment. As illustrated in FIG. 16, the output load circuit 16 includes the transistor TR1, the inductor L2, the resistors R1 to R3, the capacitors C2 and C3, and the thermistor RTH1. The transistor TR1 is the resistance element 17 and is a PMOS (Positive-Channel Metal Oxide Semiconductor) transistor. The source S of the transistor TR1 is connected to the node N1, the drain D of the transistor TR1 is connected to the node N2, and the gate G of the transistor TR1 is connected to a node N6. The resistor R1 is connected between the nodes N1 and N6. The node N6 is connected to the ground via the resistor R3 and the thermistor RTH1. The adjustment circuit 19 has the resistances R1 and R3 and the thermistor RTH1, and adjusts the gate voltage of the transistor TR1. When the temperature becomes high, the resistance value of the thermistor RTH1 becomes low, and the gate voltage of the transistor TR1 becomes low. Thereby, the resistance value between the source and the drain of the transistor TR1 becomes low. When the temperature becomes low, the resistance value of the thermistor RTH1 becomes high, and the gate voltage of the transistor TR1 becomes high. Thereby, the resistance value between the source and the drain of the transistor TR1 becomes high. Therefore, the transistor TR1 can be used as the resistance element 17. Other configurations are the same as those in FIG. 9 of the second variation of the first embodiment, and the description thereof will be omitted.

Eighth Variation of First Embodiment

Figure 17:
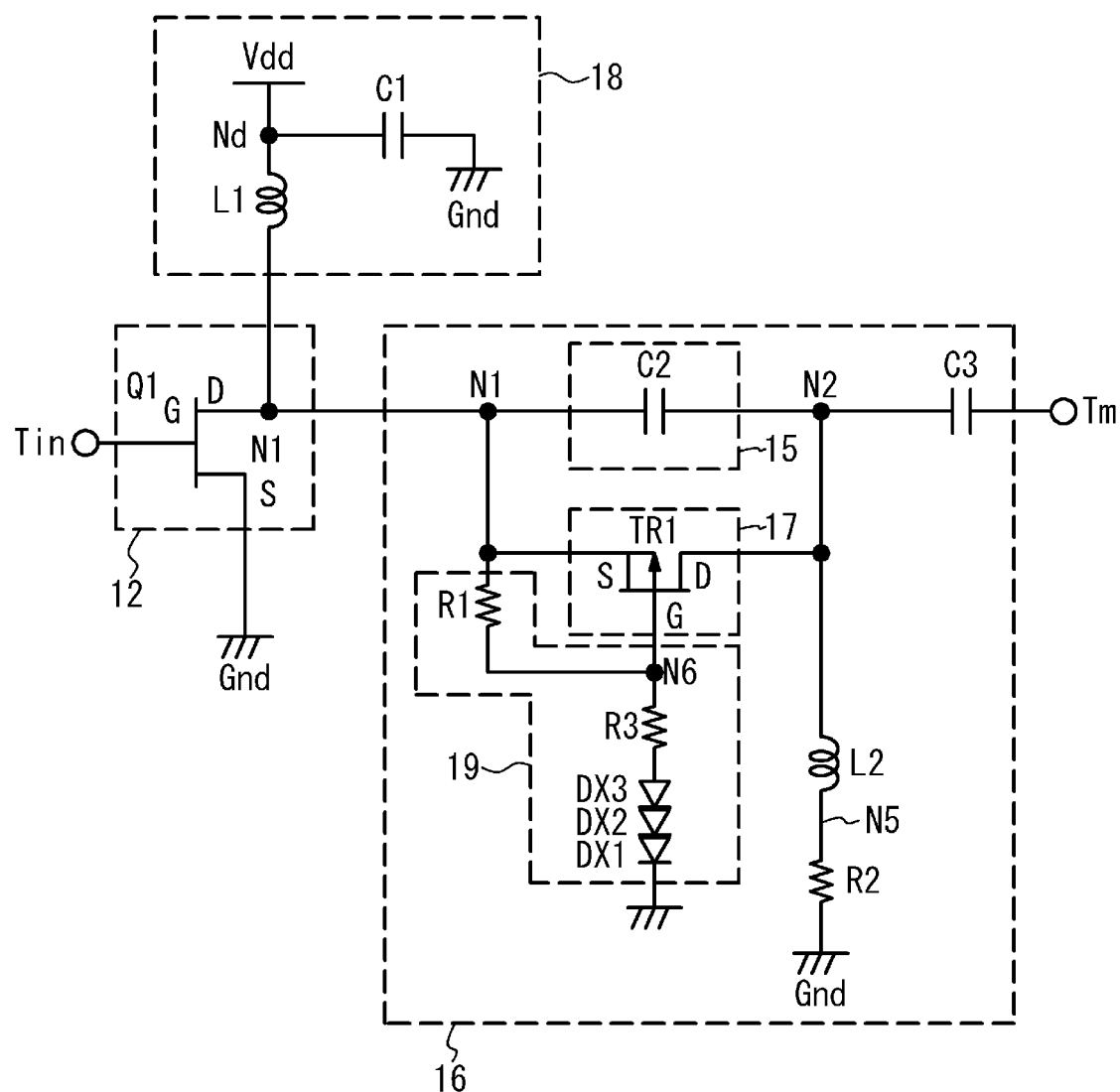
FIG. 17 is a circuit diagram of a pre-stage amplifier circuit according to an eighth variation of the first embodiment.

FIG. 17 is a circuit diagram of a pre-stage amplifier circuit according to an eighth variation of the first embodiment. As illustrated in FIG. 17, the output load circuit 16 includes the transistor TR1, the diodes DX1 to DX3, the inductor L2, the resistors R1 to R3, and the capacitors C2 and C3. In the eighth variation of the first embodiment, the thermistor RTH1 of the seventh variation of the first embodiment is replaced with the plurality of diodes DX1 to DX3 connected in the forward direction. The adjustment circuit 19 has the resistors R1 and R3 and the diodes DX1 to DX3. Other configurations are the same as those in FIG. 16 of the seventh variation of the first embodiment, and the description thereof will be omitted.

Ninth Variation of First Embodiment

Figure 18:
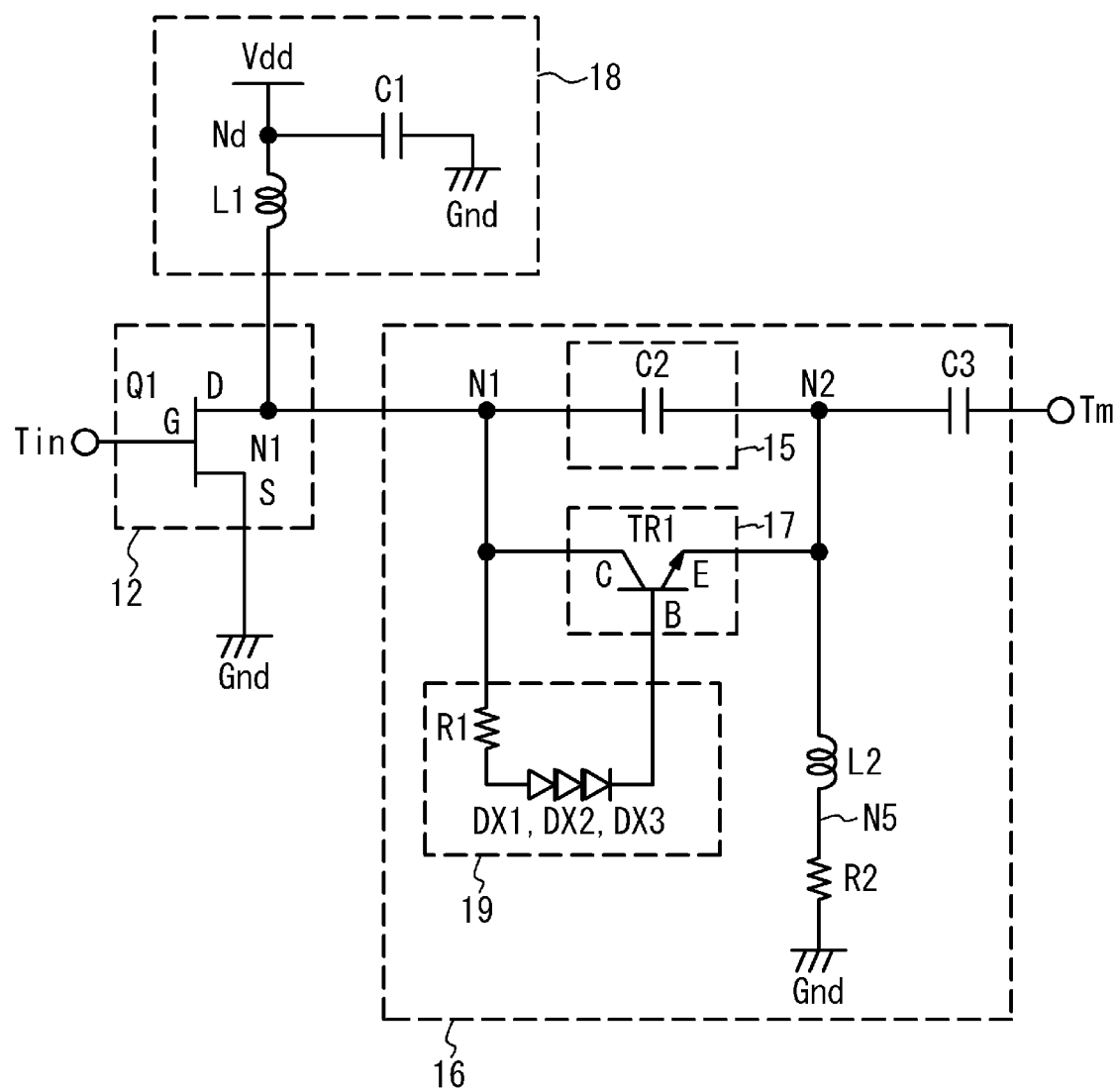
FIG. 18 is a circuit diagram of a pre-stage amplifier circuit according to a ninth variation of the first embodiment.

FIG. 18 is a circuit diagram of a pre-stage amplifier circuit according to a ninth variation of the first embodiment. As illustrated in FIG. 18, the output load circuit 16 includes the transistor TR1, the diodes DX1 to DX3, the inductor L2, the resistors R1 and R2, and the capacitors C2 and C3. In the ninth variation of the first embodiment, the thermistor RTH1 of the first variation of the first embodiment is replaced with the plurality of diodes DX1 to DX3 connected in the forward direction. The adjustment circuit 19 has the resistor R1 and the diodes DX1 to DX3. Other configurations are the same as those in FIG. 9 of the second variation of the first embodiment, and the description thereof will be omitted.

Tenth Variation of First Embodiment

Figure 19:
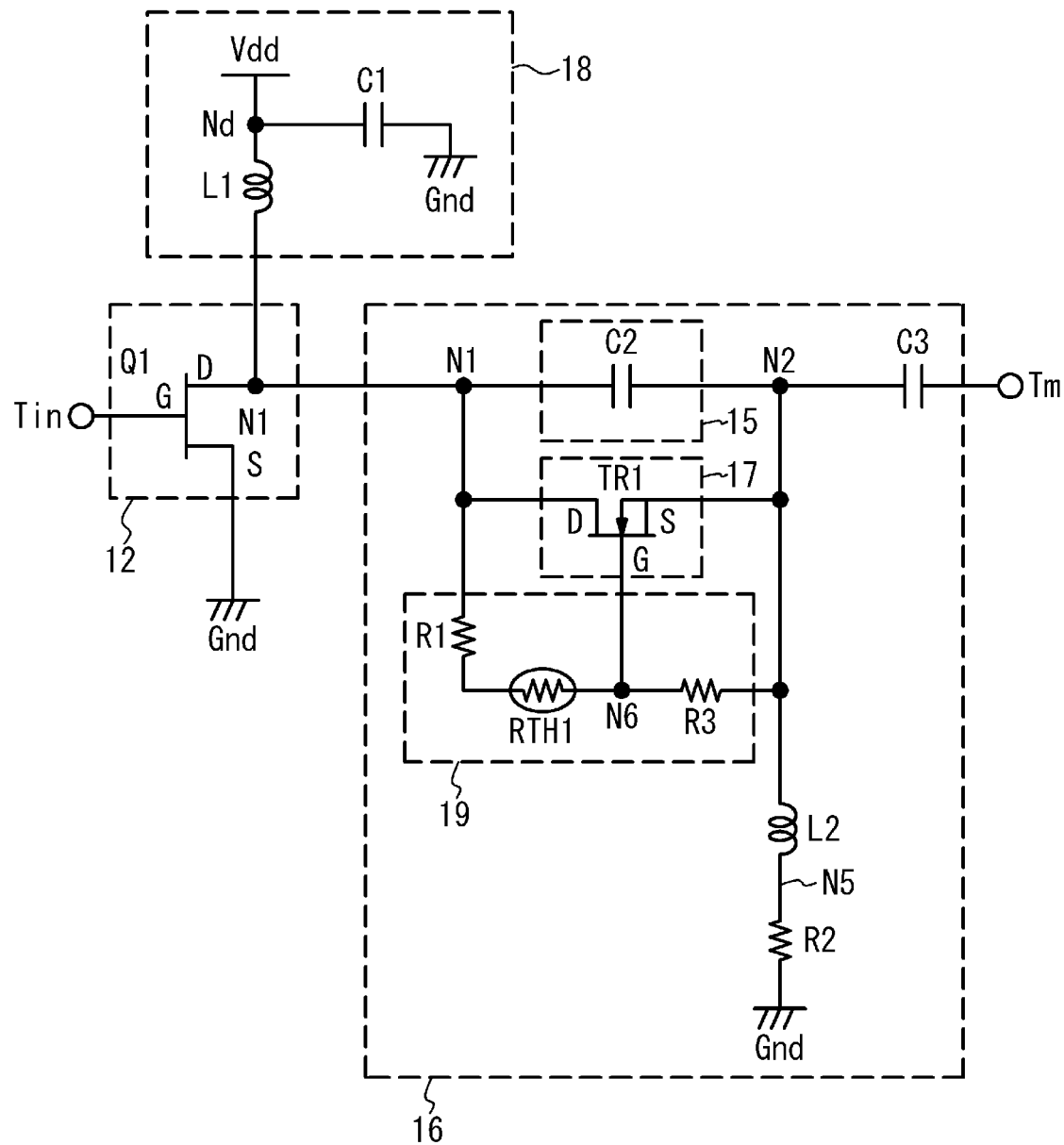
FIG. 19 is a circuit diagram of a pre-stage amplifier circuit according to a tenth variation of the first embodiment.

FIG. 19 is a circuit diagram of a pre-stage amplifier circuit according to a tenth variation of the first embodiment. As illustrated in FIG. 19, the output load circuit 16 includes the transistor TR1, the inductor L2, the resistors R1 to R3, the capacitors C2 and C3, and the thermistor RTH1. The transistor TR1 is the resistance element 17, and is an NMOS (Negative-channel Metal Oxide Semiconductor) transistor. The source S of the transistor TR1 is connected to the node N2, the drain D of the transistor TR1 is connected to the node N1, and the gate G of the transistor TR1 is connected to the node N6. The resistor R1 and the thermistor RTH1 are connected between the nodes N1 and N6. The resistor R3 is connected between the nodes N2 and N6. The adjustment circuit 19 has the resistances R1 and R3 and the thermistor RTH1, and adjusts the gate voltage of the transistor TR1. When the temperature becomes high, the resistance value of the thermistor RTH1 becomes low, and the gate voltage of the transistor TR1 becomes high. Thereby, the resistance value between the source and the drain of the transistor TR1 becomes low. When the temperature becomes low, the resistance value of the thermistor RTH1 becomes high, and the gate voltage of the transistor TR1 becomes low. Thereby, the resistance value between the source and the drain of the transistor TR1 becomes high. Therefore, the transistor TR1 can be used as the resistance element 17. Other configurations are the same as those in FIG. 9 of the second variation of the first embodiment, and the description thereof will be omitted.

Eleventh Variation of First Embodiment

Figure 20:
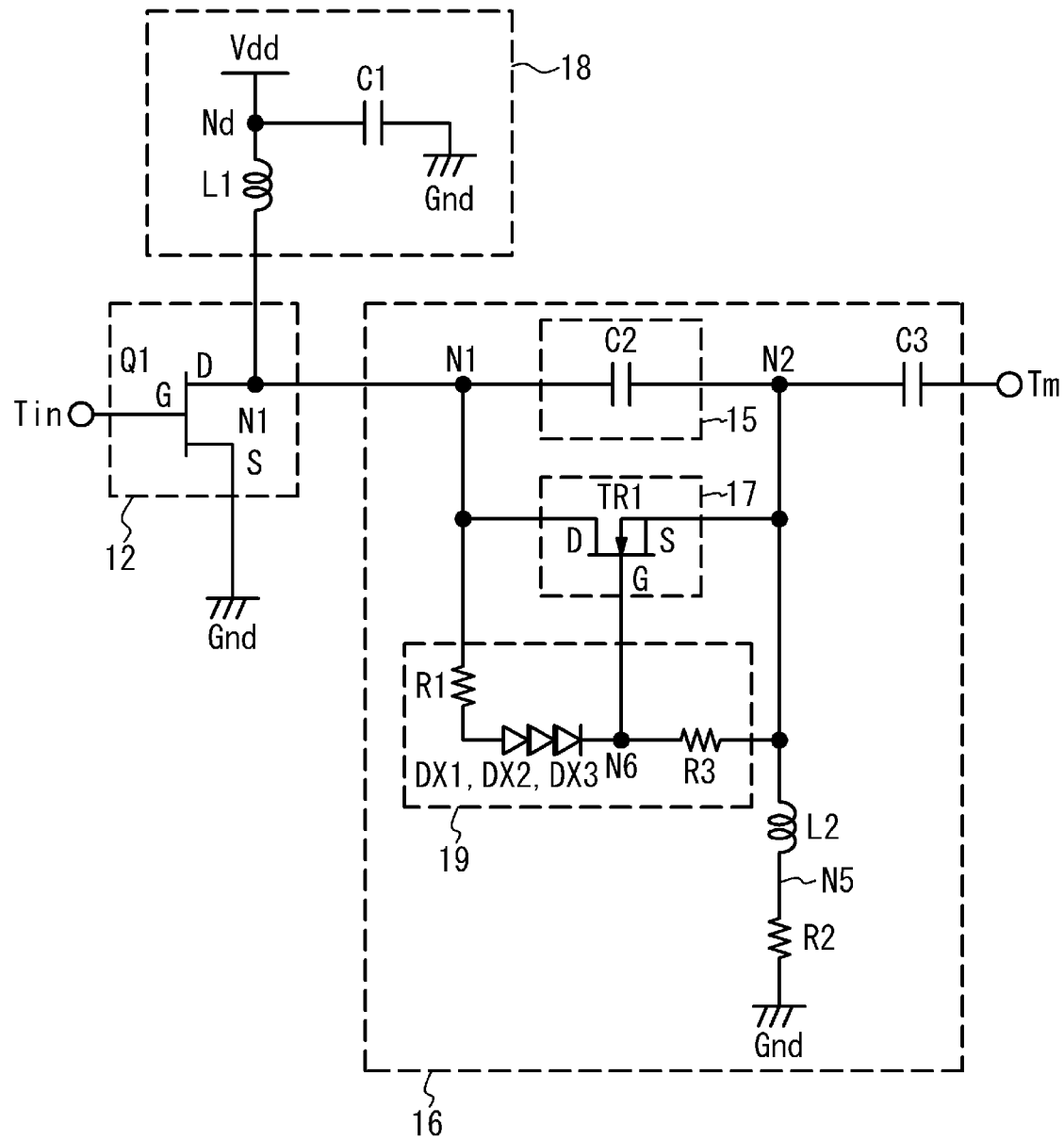
FIG. 20 is a circuit diagram of a pre-stage amplifier circuit according to an eleventh variation of the first embodiment.

FIG. 20 is a circuit diagram of a pre-stage amplifier circuit according to an eleventh variation of the first embodiment. As illustrated in FIG. 20, the output load circuit 16 includes the transistor TR1, the diodes DX1 to DX3, the inductor L2, the resistors R1 to R3, and the capacitors C2 and C3. In the eleventh variation of the first embodiment, the thermistor RTH1 of the tenth variation of the first embodiment is replaced with the plurality of diodes DX1 to DX3 connected in the forward direction. The adjustment circuit 19 has the resistors R1 and R3 and the diodes DX1 to DX3. Other configurations are the same as those in FIG. 19 of the tenth variation of the first embodiment, and the description thereof will be omitted.

Also in the third to the eleventh variations of the first embodiment, as in the first embodiment and the first and the second variations thereof, at low temperature, the resistance component of the load impedance is high and the load impedance is close to the efficiency matching, and at high temperature, the resistance component of the load impedance is low and the load impedance is close to the output matching. Thus, the efficiency at room temperature can be increased.

Second Embodiment

Figure 21:
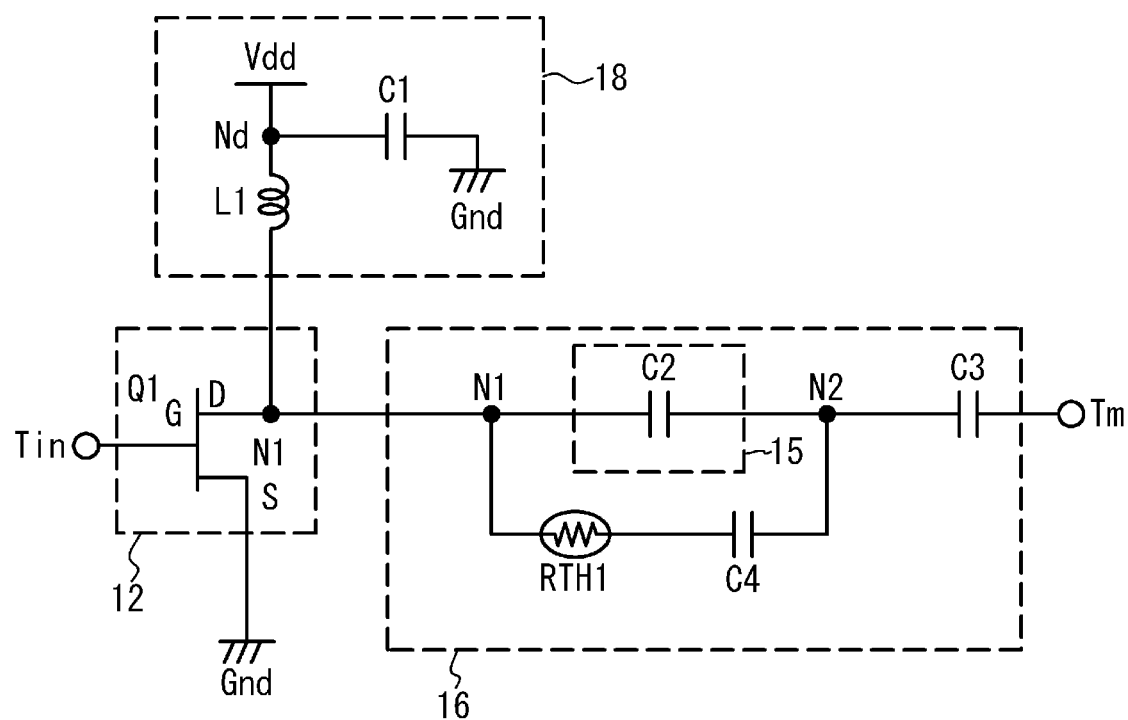
FIG. 21 is a circuit diagram of a pre-stage amplifier circuit according to a second embodiment.

The second embodiment represents an example in which the resistance component of the load impedance at the time of the output matching is higher than the resistance component of the load impedance at the time of the efficiency matching. FIG. 21 is a circuit diagram of a pre-stage amplifier circuit according to a second embodiment. As illustrated in FIG. 21, the output load circuit 16 includes the capacitors C2 to C4, and the thermistor RTH1. The capacitor C2 is the reactance element 15. The thermistor RTH1 and the capacitor C4 are connected in parallel with the capacitor C2 between the nodes N1 and N2. The thermistor RTH1 is the resistance element 17, has a PTC (Positive Temperature Coefficient), and has a high resistance value as the temperature becomes high. Other configurations are the same as those in FIG. 6 of the first variation of the first embodiment, and the description thereof will be omitted.

Figure 22:
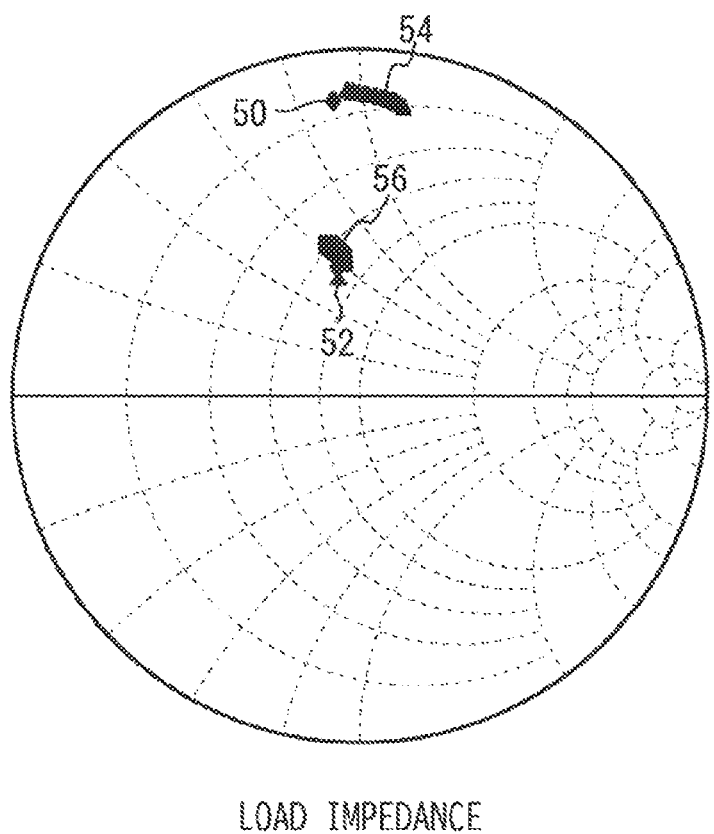
FIG. 22 is a diagram illustrating a load impedance of an output load circuit in the second embodiment.

The load impedance when the terminal Tm was viewed from the drain D of the FET Q1 was simulated. The simulation conditions are as follows.
  Capacitor C1: 4 pF
  Capacitor C2: 0.5 pF
  Capacitor C3: 4 pF
  Capacitor C4: 2.2 pF
  Inductor L1: 1 nH
  Thermistor RTH 1: 6Ω at 25° C., 20Ω at 100° C.
  FET Q1: GaN HEMT FIG. 22 is a diagram illustrating a load impedance of an output load circuit in the second embodiment. As illustrated in FIG. 22, the impedance 50 of the output matching has a lower resistance component than the impedance 52 of the efficiency matching, and the reactance component of positive (inductive). The impedance 54 at the temperature of 100° C. is close to the impedance 50, and the impedance 56 at the temperature of 25° C. is close to the impedance 52.

Even if the impedance 50 of the output matching and the impedance 52 of the efficiency matching are different from those of the first embodiment and its variations as in the second embodiment, the output load circuit 16 can be used to bring the load impedance at high temperature closer to the impedance 50 and bring the load impedance at low temperature closer to the impedance 52. Although the example of the thermistor RTH1 is described as the resistance element 17, the resistance element 17 may be the diode or the transistor.

Third Embodiment

Figure 23:
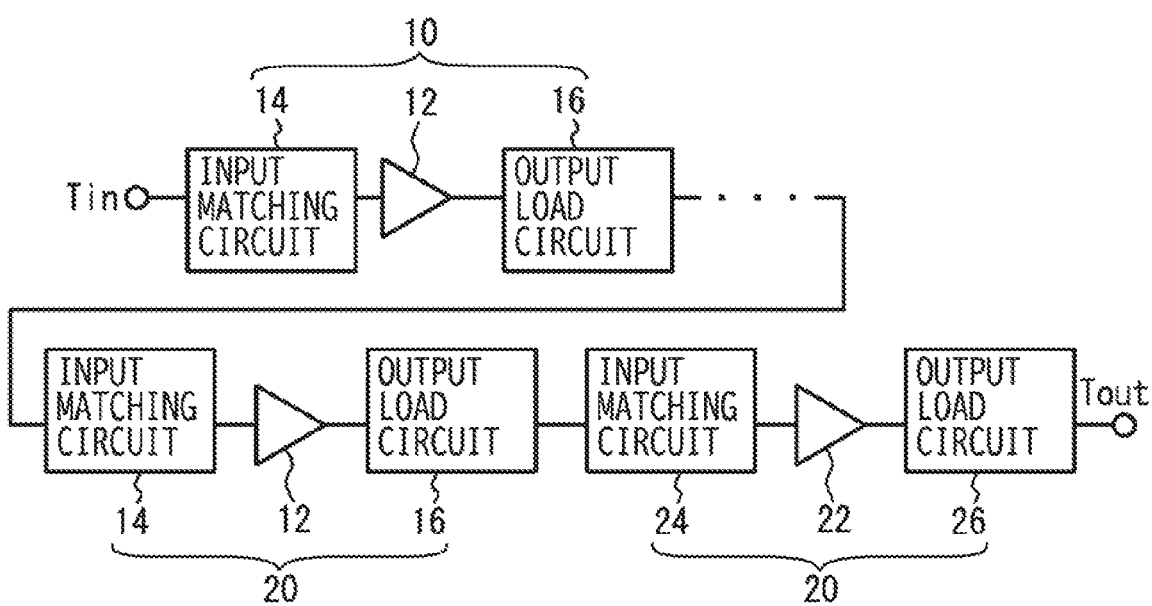
FIG. 23 is a block diagram of an amplifier circuit according to a third embodiment.

FIG. 23 is a block diagram of an amplifier circuit according to a third embodiment. The illustration of the bias circuit is omitted. As illustrated in FIG. 23, a plurality of pre-stage amplifier circuits 10 are provided. In at least one output load circuit 16 among the output load circuits 16 of the plurality of pre-stage amplifier circuits 10, the load impedance may change depending on the temperature as in the first embodiment and its modifications.

According to the first to the third embodiments and its variations, the output load circuit 16 (load circuit) in the pre-stage amplifier circuit 10 changes the load impedance of the amplifier (first amplifier) without being controlled by an external circuit so that the saturation power Psat at a high temperature (first temperature) is higher than that at a low temperature (second temperature) and the efficiency Eff at high temperature is lower than the efficiency Eff at low temperature. Thereby, the saturation power Psat can be increased at high temperature where a large saturation power Psat is required, and the efficiency Eff can be increased at low temperature where the saturation power Psat is sufficient. Therefore, the efficiency at low temperature is increased and the power consumption can be suppressed.

The high temperature and the low temperature are, for example, 80° C. and 30° C., respectively, and a difference between the high temperature and the low temperature is, for example, 30° C. or higher, preferably 50° C. or higher. A difference between the saturation powers Psat at high temperature and low temperature is, for example, 0.5 dBm or more, preferably 1 dBm or more. Further, a difference between the efficiencies Eff of the operating point at high temperature and low temperature is, for example, 5% or more, preferably 10% or more.

The output load circuit 16 includes the reactance element 15, and the resistance element 17 having a first resistance value at high temperature and a second resistance value at low temperature different from each other. It is easier to change the resistance value of the resistance element 17 with temperature than to change the reactance of the reactance element 15 with temperature. Therefore, the load impedance can be changed more easily depending on the temperature.

The reactance element 15 is connected in series between the amplifier 12 and the terminal Tm (i.e., the output terminal that outputs the high frequency signal amplified by the amplifier 12). The resistance element 17 is connected in parallel with the reactance element 15 between the amplifier 12 and the terminal Tm. This makes it possible to change the load impedance.

As illustrated in FIGS. 8 and 11 of the first embodiment and its variations, the load impedances 54 and 56 are inductive, and the resistive component of the load impedance 54 at high temperature is higher than the resistive component of the load impedance 56 at low temperature. Thereby, the reactance element 15 and the resistance element 17 can be used to bring the load impedance 54 at high temperature close to the impedance 50 of the output matching and bring the load impedance 56 at low temperature close to the impedance 52 of the efficiency matching.

The reactance element 15 is the capacitive element, and the first resistance value of the resistance element 17 at high temperature is lower than the second resistance value at low temperature. Thereby, the load impedance 54 at high temperature can be brought close to the impedance 50 of the output matching and the load impedance 56 at low temperature can be brought close to the impedance 52 of the efficiency matching.

By using the thermistor RTH1 as the resistance element 17, the resistance value of the resistance element 17 can be made different depending on the temperature. By using the thermistor RTH1 as the resistance element 17, the accuracy of the changing resistance value can be improved, and the accuracy of the changing load impedance can be improved. Therefore, the characteristics of the amplifier circuit can be improved.

The resistance element 17 is a transistor TR1 having a first terminal connected to a first end of the reactance element 15 and a second terminal connected to a second end of the reactance element 15. The adjustment circuit 19 makes the voltage of the control terminal of the transistor different at high temperature and low temperature. Thereby, the resistance value of the resistance element 17 can be changed more greatly when the temperature changes, as compared with the case where the thermistor RTH1 is used for the resistance element 17. Further, the resistance value can be adjusted more accurately, as compared with the case where the diode D1 is used for the resistance element 17. When the transistor TR1 is the bipolar transistor, the first terminal is one of the emitter and the collector, the second terminal is the other of the emitter and the collector, and the control terminal is the base. When the transistor TR1 is the FET, the first terminal is one of the source and the drain, the second terminal is the other of the source and the drain, and the control terminal is the gate.

The resistance element 17 is the diode D1 connected in parallel with the reactance element 15 between the nodes N1 and N2, and the adjustment circuit 19 makes the voltage difference across both ends of the diode D1 different at high temperature and low temperature. Thereby, the resistance value of the resistance element 17 can be changed more greatly when the temperature changes, as compared with the case where the thermistor RTH1 is used for the resistance element 17. Further, the resistance element 17 can be realized at a lower cost as compared with the case where the transistor TR1 is used for the resistance element 17.

When the amplifiers 12 and 22 are GaN HEMTs, the impedance 50 of the output matching and the impedance 52 of the efficiency matching are set as illustrated in FIG. 4. Therefore, it is preferable to provide the output load circuit 16.

The post-stage amplifier circuit 20 of a final stage is provided after the pre-stage amplifier circuit 10. That is, the amplifier 22 (second amplifier) amplifies the output signal of the amplifier 12. In this case, when the temperature becomes high, the saturation power Psat of the post-stage amplifier circuit 20 of the final stage becomes small, and the saturation power Psat of the pre-stage amplifier circuit 10 is required to increase. On the other hand, at low temperature, it is not necessary to increase the saturation power Psat of the pre-stage amplifier circuit 10. Therefore, the efficiency at low temperature can be improved by providing the output load circuit 16.

The embodiments disclosed here should be considered illustrative in all respects and not restrictive. The present disclosure is not limited to the specific embodiments described above, but various variations and changes are possible within the scope of the gist of the present disclosure as described in the claims.

What is claimed is:

1. An amplifier circuit comprising:
a first amplifier that amplifies a high frequency signal; and
a load circuit that changes a load impedance of the first amplifier without being controlled by an external circuit so that a saturation power at a first temperature is higher than a saturation power at a second temperature lower than the first temperature, and an efficiency at the first temperature is lower than an efficiency at the second temperature, and
wherein the load circuit includes a reactance element, and a resistance element having a first resistance value at the first temperature and a second resistance value at the second temperature different from each other.

2. The amplifier circuit according to claim 1, wherein the reactance element is connected in series between the first amplifier and an output terminal, and the resistor element is connected in parallel with the reactance element between the first amplifier and the output terminal.

3. The amplifier circuit according to claim 2, wherein the load impedance is inductive, and a resistive component of the load impedance at the first temperature is higher than a resistive component of the load impedance at the second temperature.

4. The amplifier circuit according to claim 3, wherein the reactance element is a capacitive element, and the first resistance value is lower than the second resistance value.

5. The amplifier circuit according to claim 1, wherein the resistive element is a thermistor.

6. The amplifier circuit according to claim 1, further comprising:
- a transistor that has a first terminal connected to a first end of the reactance element and a second terminal connected to a second end of the reactance element, and is the resistance element; and
- an adjustment circuit that makes a voltage of a control terminal of the transistor different between the first temperature and the second temperature.

7. The amplifier circuit according to claim 1, further comprising:
- a diode that is connected in parallel with the reactance element and is the resistance element; and
- an adjustment circuit that makes a voltage difference across both ends of the diode different between the first temperature and the second temperature.

8. The amplifier circuit according to claim 1, wherein the first amplifier is a GaN HEMT.

9. The amplifier circuit according to claim 1, further comprising:
- a second amplifier that amplifies an output signal of the first amplifier.

* * * * *